(12) United States Patent
Inoue et al.

(10) Patent No.: US 7,571,617 B2
(45) Date of Patent: Aug. 11, 2009

(54) FAN CONTROL APPARATUS AND FAN CONTROL METHOD

(75) Inventors: Kenichi Inoue, Kanagawa (JP); Toshiaki Notsuyu, Kanagawa (JP)

(73) Assignee: Sony Corporation (JP)

( * ) Notice: Subject to any disclaimer, the term of this patent is extended or adjusted under 35 U.S.C. 154(b) by 367 days.

(21) Appl. No.: 10/782,434

(22) Filed: Feb. 18, 2004

(65) Prior Publication Data
US 2004/0202534 A1 Oct. 14, 2004

(30) Foreign Application Priority Data
Feb. 27, 2003 (JP) .................... P2003--051845

(51) Int. Cl.
*G05D 23/32* (2006.01)
*F25D 23/12* (2006.01)

(52) U.S. Cl. .................... 62/157; 62/234; 62/259.2; 236/46 C; 236/49.3; 361/695

(58) Field of Classification Search .................... 62/157, 62/158, 231, 259.2; 236/49.3, 46 A, 46 C, 236/46 R; 361/690, 695
See application file for complete search history.

(56) References Cited

U.S. PATENT DOCUMENTS

| | | | | |
|---|---|---|---|---|
| 5,279,458 A | * | 1/1994 | DeWolf et al. ................ | 236/47 |
| 5,513,361 A | * | 4/1996 | Young .......................... | 713/320 |
| 5,657,638 A | * | 8/1997 | Erdman et al. ................ | 62/182 |
| 5,687,079 A | * | 11/1997 | Bauer et al. ................... | 700/70 |
| 5,764,506 A | * | 6/1998 | Eynaud ......................... | 700/12 |
| 5,881,298 A | * | 3/1999 | Cathey .......................... | 713/324 |
| 5,906,315 A | * | 5/1999 | Lewis et al. ................... | 236/49.3 |
| 6,014,611 A | * | 1/2000 | Arai et al. ..................... | 702/132 |
| 6,079,219 A | * | 6/2000 | Katsuki ......................... | 62/180 |
| 6,259,172 B1 | * | 7/2001 | Lee ............................... | 307/125 |
| 2002/0126431 A1 | * | 9/2002 | Yanagisawa ................... | 361/103 |
| 2003/0234625 A1 | * | 12/2003 | Frankel et al. ................ | 318/268 |

FOREIGN PATENT DOCUMENTS

| | | |
|---|---|---|
| JP | 02-251072 A | 10/1990 |
| JP | 04-372526 A | 12/1992 |
| JP | 09-171420 A | 6/1997 |
| JP | 10-143257 A | 5/1998 |
| JP | 2001-056724 A | 2/2001 |
| JP | 2001-227494 A | 8/2001 |
| JP | 2002-252315 A | 9/2002 |
| JP | 2002-345293 A | 11/2002 |
| JP | 2003-029850 A | 1/2003 |

* cited by examiner

*Primary Examiner*—Marc E Norman
(74) *Attorney, Agent, or Firm*—Lerner, David, Littenberg, Krumholz & Mentlik, LLP

(57) ABSTRACT

A fan control apparatus and method that sets a stop period constant at a starting time by adding a fan control in a time axis to a fan control by a temperature sensor. The fan control apparatus includes a temperature sensor that detects the temperature in the equipment body; and a CPU and a sub-microcomputer that has a temperature control function, that perform the control of the cooling fans according to the detected temperature value. The CPU performs a communication with a server connected to the equipment body via a network; and the sub-microcomputer performs the control of the cooling fans according to the time value based on the communication commencement.

10 Claims, 10 Drawing Sheets

Block diagram showing constitution of fan control system

FIG. 1  Block diagram showing constitution of fan control system

Flowchart showing polling set operation

FIG. 3 Flowchart showing fan control operation

Flowchart showing fan control operation utilizing timer

FIG. 6

| Operational Mode | HDD | DVD-RW | Fan Control (Effective Rotational Freq.) 設定回転数の70% |
|---|---|---|---|
| 1 | Standby | Stop | 60% of set rotational freq. |
| 2 | Standby | Reproduction | 70% of set rotational freq. |
| 3 | Record | Stop | 80% of set rotational freq. |
| 4 | Record | Reproduction | 90% of set rotational freq. |
| 5 | Reproduction | Record | 100% of set rotational freq. |

Diagram showing fan control corresponding to operational modes

Flowchart showing fan control operation corresponding to operational modes

Flowchart showing fan control operation where rotational freq. has ramp-shaped risiing Diagram showing internal arrangement of equipment frequency

FAN CONTROL APPARATUS AND FAN CONTROL METHOD

BACKGROUND OF THE INVENTION

1. Field of the Invention:

The present invention relates to a fan control apparatus and a fan control method, for example, for cooling a heat generating portion in equipment by using a cooling fan.

2. Description of the Related Art:

In a conventional fan control apparatus which cools, for example, a power supply unit or an actuator of heat generating portions by using a cooling fan, the cooling fan is always made rotated when the power supply of the equipment body is turned on.

[Patent Document 1]

Japanese Laid-open Patent publication No.2001-56724

However, in the above mentioned conventional fan control apparatus, the cooling fan is always rotated whenever the power supply of the equipment body is turned on, so that there was a disadvantage that a rotation noise is always generated caused by the rotation of the cooling fan and the quality of the equipment goes down by the undesired sound in an environment where quietness is required.

Additionally, there is a method where the drive voltage is lowered such that the rotational frequency is dropped down and the like in order to reduce the rotation noise of the cooling fan, but there is a limit in order to achieve the operation with a satisfactory cooling function.

According to the control of the present invention, the subject matter lies in that the fan control is performed by a feedback using a temperature sensor and at the same time the cooling fan is stopped at the time of polling for controlling the time axis such that the rotation noise can be reduced.

The difference between the present invention and the patent document 1 will be shown hereinafter. According to the claim of this patent document 1, the fan control method has a feature that a register value corresponding to a measured temperature is transferred to a fan rotational frequency control IC so as to produce a drive voltage within the IC for controlling the fan.

The patent document 1 has a feature of controlling by means of SM bus since it is a general matter that the temperature in the equipment is measured by a temperature sensor for controlling the fan while in this point of view, firstly the temperature measured by the temperature sensor is converted to a voltage in the fan control method according to the present invention. Secondly, a sub microcomputer (micom) AD converts that voltage and downloads it to the micom as time-series data. Thirdly, the temperature data and set data are compared by a control program so as to perform the fan control. Fourthly, the fan operation voltage is an output of a 4-terminal regulator in a power supply circuit and controlled by H/L of FAN_CONT signal from the sub micom. Fifthly, there is a difference in that the present application does not use the special SM bus but uses an AD converting function of the sub micom for converting the measured temperature to data and performing a program control.

Especially, speaking of the difference of the present invention with respect to the patent document 1, there is a big difference in that a time axis fan control is added to the fan control by the temperature sensor when performing a local control by the sub micom without using the SM bus. When performing a fan control where the temperature control is preferential, the fan cannot be stopped, for example, for a few minutes at the starting time and moreover, it is impossible to set a constant stop period. A timer is used for setting a duration corresponding to the absolute time in order to stop the fan, for example, for a few minutes from the starting time of the equipment. After a few minutes elapse, it is shifted to a fan control by means of the temperature sensor.

The polling operation which requires an operation program to be renewed and the like for the equipment with respect to a server connected via the network continues less than approximately a few minutes after the equipment is activated, so that the purpose of the present invention is to stop the fan during that period in order to reduce noises and similarly to reduce power consumption.

In the patent document 1, in case of a fan control only by the temperature sensor, the fan is made stopped at the starting time and is turned on when the temperature becomes higher than the upper limit. When the temperature becomes higher than the upper limit, the fan rotates. Conversely, when it is lower than the upper limit, the fan remains in a stop state such that the temperature of the equipment increases rapidly. Consequently, the fan rotates again and cools the inside of the equipment. If the upper limit value is lowered, the fan repeats on and off in a short period such that a so-called hunting phenomenon occurs and it is impossible to make the stop period constant unless a time axis control according to the present invention is adopted.

SUMMARY OF THE INVENTION

Consequently, the present invention was made in view of the aforementioned aspect and the subject matter thereof is to propose a fan control apparatus and a fan control method which can set the stop period constant at the starting time by adding a time axis fan control additively to a fan control by means of a temperature sensor.

A fan control apparatus according to the present invention comprises temperature detecting means for detecting the temperature in the equipment body; temperature control means for controlling the cooling fan according to the temperature value detected by the temperature detecting means; communication means for communicating with a server connected to the equipment body by means of a network; and time control means for controlling the cooling fan according to the time value based on the communication commencement by the communication means; wherein the control of the cooling fan is performed by using the temperature control means and the time control means.

Accordingly, the following operation is achieved according to the present invention.

The fan control of the cooling fan is performed by using temperature control means and time control means in order to reduce noises in the main body equipment which has a communication function using communication means with the server connected to the network.

In recent years, there have been a lot of equipments for the digital audio and/or video equipments where cooling by a fan is necessary. Communication means has a function of polling as one of network connecting functions. It is possible by means of the communication means that the server downloads reservation program information and version upgrade programs periodically and automatically to the client equipments at every starting time by means of polling which is set by users. In the conventional technology, the fan rotates and generates noises whenever the main body equipment is activated, so that the rotational frequency of the fan is controlled for noise reduction, but there is a limit thereabout.

Consequently, the improvement according to the present invention lies in that the cooling fan is controlled according to the time value based on the communication commencement by the communication means using the time control means in addition to the feedback of the detected temperature value to the temperature control means using the temperature detecting means where noise reduction can be realized by the time axis control of the fan. More specifically, as the polling period by the communication means is a short period, it is possible to reduce noises by a method which stops the fan operation during a definite duration from the starting time at the polling start by the time control means.

Utilizing the fact that the polling period by the communication means of the equipment which has a network connecting function enabling a high speed data communication is short, it is controlled such that the fan is stopped for a definite duration from the starting time by the time control means. In case when the fan is stopped for a definite duration from the starting time, the temperature rises, but it does not rise to saturation degree if the stop period is short. Additionally, by arranging the temperature detecting means which always measures the internal temperature in the vicinity of an important device, it becomes possible to achieve a high speed rotational response of the fan when the temperature rises by the temperature control means and an emergency response on an abnormally high temperature.

Further, a fan control method according to the present invention comprises communication step for communicating by using communication means with a server connected to the equipment body by means of a network; temperature detecting step for detecting the temperature in the equipment body by using temperature detecting means; temperature control step for controlling the cooling fan by using temperature control means according to the temperature value detected by the temperature detecting means; and time control step for controlling the cooling fan by using time control means according to the time value based on the communication commencement by the communication means; wherein the control of the cooling fan is performed by using the temperature control means and the time control means.

Accordingly, the following operation is achieved according to the present invention.

The fan control of the cooling fan is performed by using a temperature control step and a time control step in order to reduce noises in the main body equipment which has a communication function using a communication step with the server connected to the network.

In the communication step, there is provided a polling function which is one of network connecting functions. By the communication step, it becomes possible for the server to download reservation program information and version up programs for every client-equipment periodically and automatically at the starting time by the polling which is set by users.

Consequently, according to the present invention, it is realized to reduce noises by performing a cooling fan control according to the time value based on the communication commencement by the communication step in the time control step in addition to the feedback of the temperature control value for the temperature control step by the temperature detecting step. More specifically, as the polling period in the communication step is short, it is possible to reduce noises by a method of stopping the fan operation during a definite duration from the starting time by the polling start in the time control step.

Utilizing the fact that the polling period by the communication step of the equipment which has a network connecting function enabling a high speed data communication is short, it is controlled such that the fan is stopped for a definite duration from the starting time by the time control step. In case when the fan is stopped for a definite duration from the starting time, the temperature rises, but it does not rise to saturation degree if the stop period is short. Additionally, by always measuring the internal temperature in the vicinity of an important device by the temperature detecting step, it becomes possible to achieve a high speed rotational response of the fan when the temperature rises by the temperature control step and an emergency response on an abnormally high temperature.

BRIEF DESCRIPTION OF THE DRAWINGS

FIG. 4A shows the internal temperature of the equipment body, FIG. 4B shows the power state of the equipment body, FIG. 4C shows the operation of a first fan (FAN 1) 7 and a second fan (FAN 2) 8, and FIG. 4D shows a polling operation;

FIG. 6 is a diagram showing a fan control corresponding to operational modes;

DESCRIPTION OF THE PREFERRED EMBODIMENTS

Exemplified embodiments according to the present invention will be explained properly with reference to the drawings.

Figure 1:
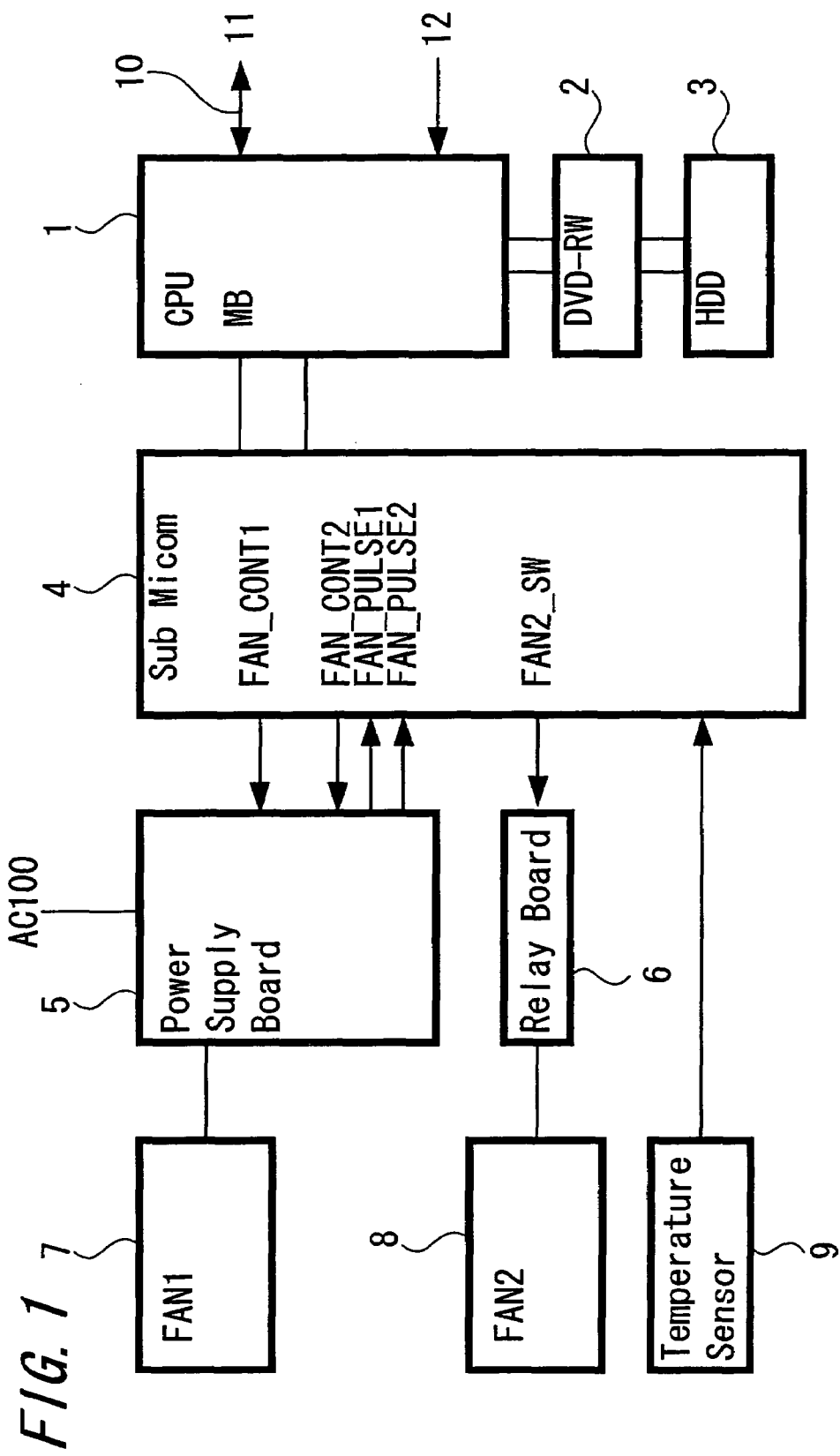
FIG. 1 is a diagram showing a constitution of a fan control system applied to an exemplified embodiment of the present invention.

FIG. 1 is a block diagram showing a constitution of a fan control system applied to an exemplified embodiment according to the present invention.

In FIG. 1, the fan control system is provided on a main board and is constituted to include a CPU (Central Processing Unit) 1 which controls the operation of the equipment, a reproducible DVD-RW (Digital Versatile DISC Rewritable) 2 which records audio data and video data on a detachable disc type recording medium, and an HDD (Hard Disc Drive) 3 which records program data readably and at the same time records audio data and video data reproducibly on a fixed disc type recording medium.

The CPU 1 is connected to a server 11 by means of a network 10 and constituted to have a communication function for downloading reservation program information and version upgrade programs, to have a state control function for shift-controlling from a standby state to a power-on state at every starting time by polling which users set by a timer reservation 12 and to have a time control function for stopping the fan operation for a definite duration from the starting time by the polling commencement which users set by the timer reservation 12. The network 10 is applied with, for example, ADSL (Asymmetric Digital Subscriber Line) which makes a high speed data communication possible.

Additionally, the fan control system is constituted to have a sub micom 4, a power supply board 5 which produces from an AC power supply a 5V-system-drive power supply voltage for the CPU 1 and the sub micom 4 and a 12V-system-drive power supply voltage for the fan, the DVD-RW 2 and the HDD 3, a relay board 6 for supplying the 12V-system-drive power supply voltage for a second fan (FAN 2) 8, a first fan (FAN 1) 7, a second fan (FAN 2) 8 and a temperature sensor 9 for detecting an internal temperature.

Figure 10:
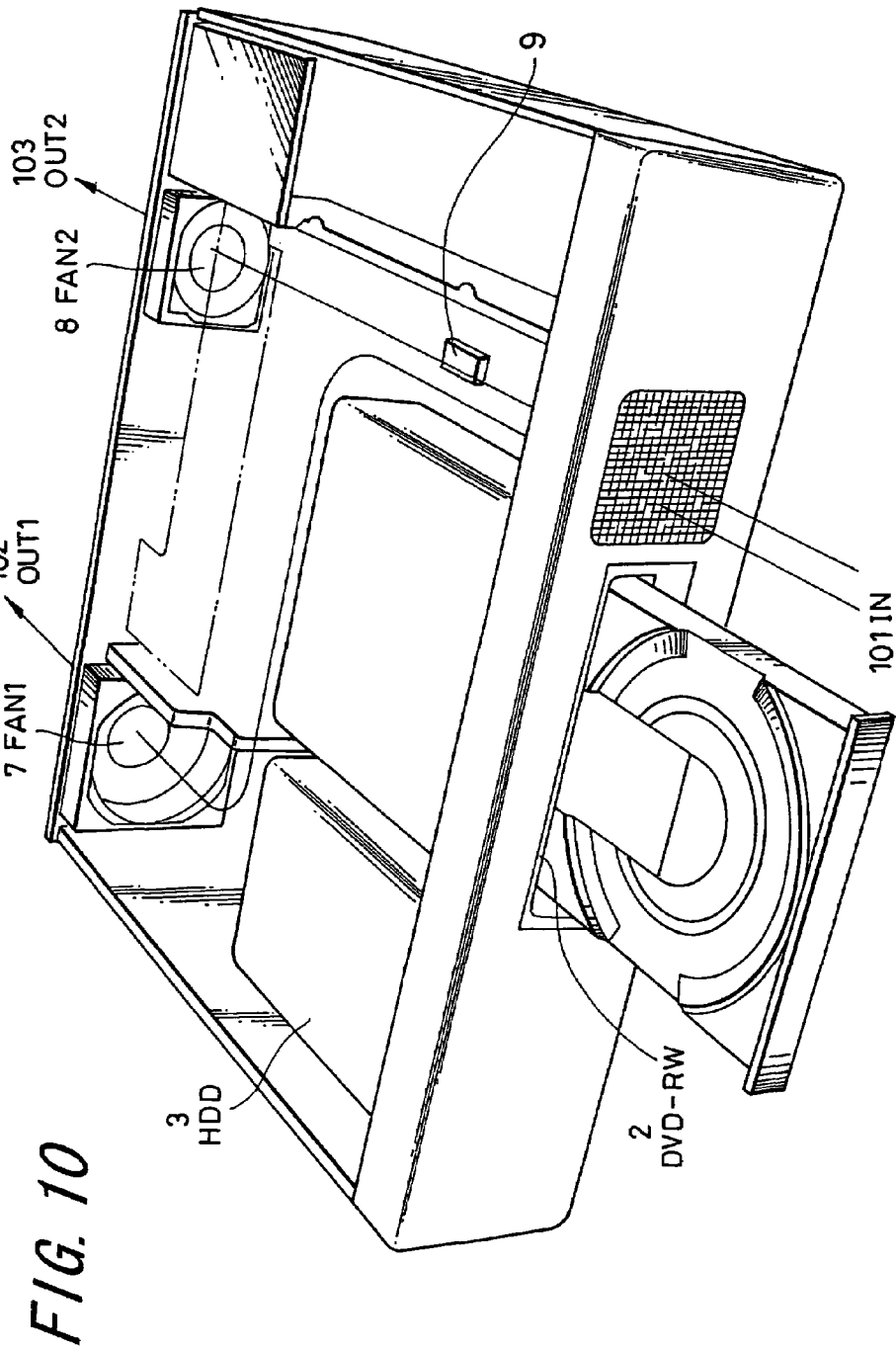
FIG. 10 is a diagram showing an internal arrangement of the equipment.

FIG. 10 is a diagram showing an internal arrangement of the equipment.

In FIG. 10, a main board equipped with the DVD-RW 2 and a peripheral unit of the CPU 1 is arranged at the center from the front to the rear of the equipment, on the other hand the HDD 3 and the power supply unit are arranged on the left side from the front to the rear thereof. Then, an outside air inlet duct IN101 is arranged at the right side of the DVD-RW 2 at the front center, the first fan (FAN 1) 7 is arranged on the rear left side of the equipment, where is linearly rear location with respect to the HDD 3 and the power supply unit, and the second fan (FAN 2) 8 is arranged on the rear center-right side of the equipment, where is linearly rear location with respect to the outside-air inlet duct IN101 on the front center-right side.

Here, the outside-air sucked in from the IN101 is introduced to an OUT1: 102 as a first flow path by the fan (FAN 1) 7, so that the first fan (FAN 1) 7 is used for cooling the power supply unit and the HDD 3. Additionally, the outside-air sucked in from the IN101 is introduced to an OUT2: 103 as a second flow path by the second fan (FAN 2) 8, so that the second fan (FAN 2) 8 is constituted so as to be used for cooling the periphery of the CPU 1 and the DVD-RW 2.

The CPU 1 and the sub micom 4 control the two of the first fan (FAN 1) 7 and the second fan (FAN 2) 8 according to the fan control program. It is constituted such that the rotation of the fan is observed by using the rotation detecting terminals of FAN_PULSE 1 and FAN_PULSE 2.

The temperature sensor 9 constitutes temperature detecting means for detecting the temperature of the equipment body. The temperature sensor 9 is arranged between outside-air inlet duct IN101 and the second fan (FAN 2) 8 corresponding to a position which the first flow path and the second flow path will commonly pass.

The CPU 1 and the sub micom 4 constitute temperature control means for controlling the first fan (FAN 1) 7 and the second fan (FAN 2) 8 according to the temperature value detected by the temperature sensor 9.

The CPU 1 constitutes communication means for performing the communication between the equipment body and the server 11 connected by means of the network 10.

The CPU 1 constitutes time control means for performing the control of the first fan (FAN 1) 7 and the second fan (FAN 2) 8 according to the time value based on the communication commencement with respect to the server 11.

The CPU 1 is constituted so as to perform with respect to the server 11 a polling communication of a definite duration at every predetermined time by its communication function and to stop the operation of the first fan (FAN 1) 7 and the second fan (FAN 2) 8 until the value of the definite duration elapses by its time control function.

The operation of the fan control system applied to the exemplified embodiment according to the present invention which is constituted in this manner will be described hereinafter.

First, the polling set operation which is a key point of the operation of this equipment body will be explained.

Figure 2:
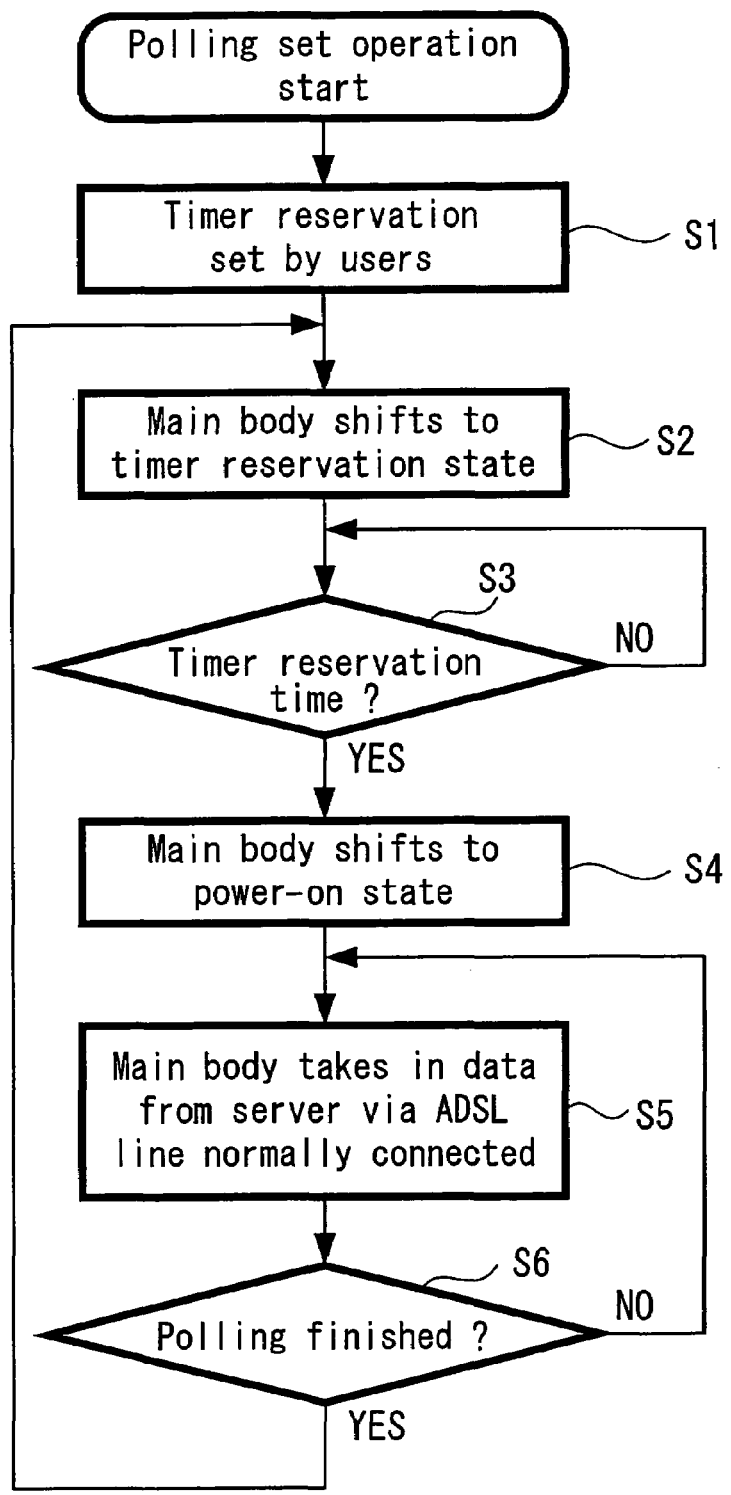
FIG. 2 is a flowchart showing a polling set operation.

FIG. 2 is a flowchart showing the polling set operation.

In FIG. 2, a timer reservation setting by users is performed in step S1. More specifically, users set a timer reservation time for starting the equipment by polling with respect to the CPU 1 by means of the timer reservation 12.

In step S2, the main body shifts to a standby state. More specifically, the CPU 1 controls to shift from a power-on state to a standby state by its state control function when the setting of the timer reservation 12 is completed.

In step S3, it is judged whether or not it is the timer-reserved-time. More specifically, the CPU 1 judges whether or not it is the timer-reserved-time set by the timer reservation 12.

When the timer-reserved-time comes in step S3, it is shifted to step S4 and in step S4, the main body is shifted to a power-on state. More specifically, the CPU 1 controls to shift from a standby state to a power-on state by its state control function when the timer-reserved-time set by the timer reservation 12 comes.

In step S5, the main body operates to take in data from the server by means of the ADSL line which is normally connected. More specifically, the CPU 1 performs a polling communications with the server 11 by its communication function at every timer-reserved-time for a definite duration via the network 10 by means of the ADSL line which is normally connected and downloads the reservation program information and version upgrade programs.

In step S6, it is judged whether or not the polling is finished. More specifically, the CPU 1 judges whether or not the polling communication with the server 11 is finished.

In step S6, if the polling is not finished, the flow returns to step S5 and the CPU 1 continues the polling communication with the server 11 until it ends.

In step S6, when the polling is finished, the flow returns to step S2 and the main body is shifted to a standby state. Then, when it is the timer-reserved-time next time in step S3, the flow is shifted to step S4, the main body is shifted to a power-on state in step S4, and the polling communication is continued in step S5 until it ends. Thereafter, processes and judgments of step S2 to step S6 repeats at every time of the polling end time and the set timer-reserved-time.

Next, it will be explained about the fan control operation after it is shifted to a power-on state.

Figure 3:
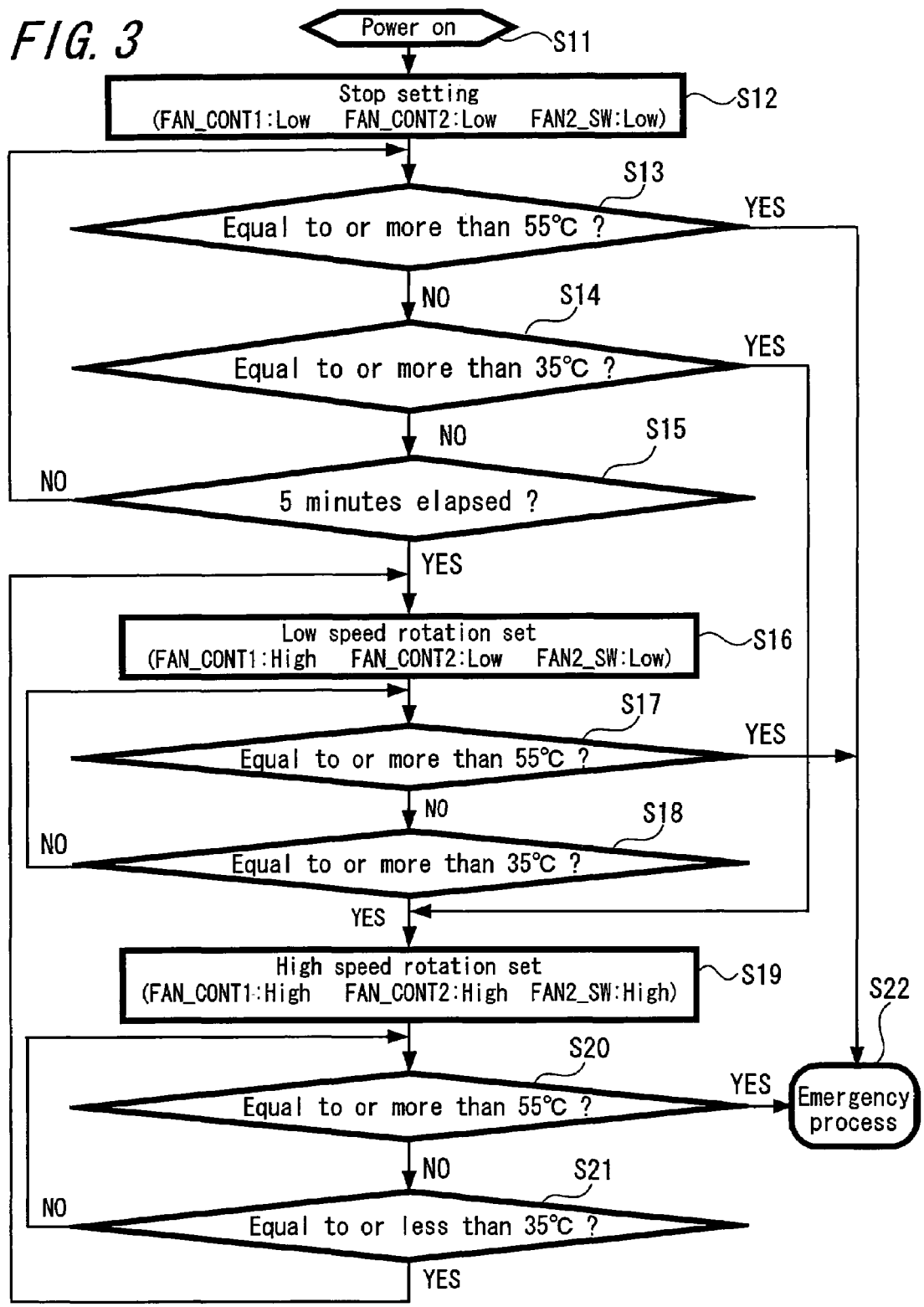
FIG. 3 is a flowchart showing a fan control operation.

FIG. 3 is a flowchart showing the fan control operation. FIG. 3 shows the fan control operation after the main body in step S4 shown in FIG. 2 is shifted to a power-on state.

In step S11, the equipment body is shifted to a power-on state. More specifically, the CPU 1 controls to shift from a standby state to a power-on state by its state control function when it becomes the timer-reserved-time set by the timer reservation 12 in step S4 shown in FIG. 2.

In step S12, a stop setting is performed. More specifically, with respect to the sub micom 4 for a stop condition, the CPU 1 makes the first fan control terminal FAN_CONT1 be a low-level (Low), the second fan control terminal FAN_CONT2 be a low-level (Low) and the fan switching control terminal FAN2_SW be a low-level (Low), all of which are controlled by a fan control program. In this way, the supply of the 12V-system-drive power supply voltage from the power supply board 5 and the relay board 6 to the first fan (FAN 1) 7 and the second fan (FAN 2) 8 is stopped, so that both of the first fan (FAN 1) 7 and the second fan (FAN 2) 8 become in a stop state.

In step S13, it is judged whether or not the internal temperature of the equipment body is equal to or more than 55 degree. More specifically, the CPU 1 judges with respect to the sub micom whether or not the temperature value detected by the temperature sensor 9 is equal to or more than 55 degree.

In this way, if the temperature is made preferential for controlling as in the conventional technology, it is possible neither to stop the fan for 5 minutes at the starting time nor at the same time to set the stop period invariable. On the other hand, according to the exemplified embodiment of the present invention, with respect to the sub micom 4, the CPU 1 makes it measure the internal temperature of the equipment by the temperature sensor 9, makes it observe the state by directing the first fan (FAN 1) 7 and the second fan (FAN 2) 8 to generate pulses corresponding to the rotational frequency and by using the rotation detecting terminals FAN_PULSE 1 and FAN_PULSE 2 and at the same time makes it control the supply of the 12V-system-drive power supply voltage for the first fan (FAN 1) 7 and the second fan (FAN 2) 8.

In step S13, when the internal temperature of the equipment body is not equal to nor more than 55 degree, the flow is shifted to step S14 and it is judged in step S14 whether or not the internal temperature of the equipment body is equal to or more than 35 degree. More specifically, with respect to the sub micom 4, the CPU 1 judges whether or not the temperature value detected by the temperature sensor 9 is equal to or more than 35 degree. Here, 35° C. is a guarantee temperature of the used device.

In step S14, when the internal temperature of the equipment body is not equal to nor more than 35 degree, the flow is shifted to step S15 and it is judged in step S15 whether or not 5 minutes have elapsed since the equipment body is shifted to a power-on state. More specifically, the CPU 1 judges by its time control function whether or not a definite duration, that is, 5 minutes here has elapsed. It should be noted that it is possible for users to set the definite duration by the timer reservation 12 with respect to the CPU 1 such as to correspond to the time when the CPU 1 finishes the polling communication with the server 11. Additionally, it is possible to set the definite duration value such as to correspond to the time when the CPU 1 finishes the polling communication with the server 11 by sampling a plurality of polling periods.

If it does not elapse 5 minutes after the equipment body is shifted to a power-on state in step S15, the flow returns to step S13 and repeats the judgment whether or not the internal temperature of the equipment body is equal to or more than 55 degree in step S13, the judgment whether or not the internal temperature of the equipment body is equal to or more than 35 degree in step S14 and the judgment whether or not 5 minutes elapsed after the equipment body was shifted to a power-on state in step S15.

In this way, since the polling period is short as for around 5 minutes after the starting time, the fan operation is made stopped for a definite duration even when the state is shifted from a standby state to a power-on state of the polling start by controlling the first fan (FAN 1) 7 and the second fan (FAN 2) 8 for a time axis control to stop during that period such that quietness is maintained at the polling time so as to improve the ambient noise quality and to reduce the power consumption.

When 5 minutes elapsed after the equipment body was shifted to a power-on state instep S15, the flow is shifted to step S16, and a low speed rotation setting is performed in step S16. More specifically, with respect to the sub micom 4 for a stop condition, the CPU 1 makes the first fan control terminal FAN_CONT1 be a high-level (High), the second fan control terminal FAN_CONT2 be a low-level (Low) and the fan switching control terminal FAN2_SW be a low-level (Low), all of which are controlled by a fan control program. In this way, the supply of the 12V-system-drive power supply voltage with respect to the first fan (FAN 1) 7 from the power supply board 5 and the relay board 6 is performed by a voltage value or a duty of a pulse width which corresponds to the low speed rotation setting, so that only the first fan (FAN 1) 7 becomes a low speed rotating state.

In this way, with respect to the sub micom 4, the CPU 1 sets the drive voltage or the duty of the pulse width low after 5 minutes from the starting time so as to rotate the first fan (FAN 1) 7 in a low speed and when the first fan (FAN 1) 7 and the second fan (FAN 2) 8 are stopped at the starting time, it is made such that the temperature rises but it does not rise to saturation degree owing to the short period, so that it is possible to maintain quietness at the polling end so as to improve the ambient noise quality and to reduce the power consumption.

It is judged in step S17 whether or not the internal temperature of the equipment body is equal to or more than 55 degree. More specifically, with respect to sub micom 4, CPU 1 judged whether or not the temperature value detected by the temperature sensor 9 is equal to or more than 55 degree.

In step S17, when the internal temperature of the equipment body is not equal to nor more than 55 degree, the flow is shifted to step S18 and it is judged in step S18 whether or not the internal temperature of the equipment body is equal to or more than 35 degree. More specifically, with respect to the sub micom 4, the CPU 1 judges whether or not the temperature value detected by the temperature sensor 9 is equal to or more than 35 degree.

If the internal temperature of the equipment body is not equal to nor more than 35 degree in step S18, the flow returns to step S17 and repeats the judgment whether or not the internal temperature of the equipment body is equal to or more than 55 degree in step S17 and the judgment whether or not the internal temperature of the equipment body is equal to or more than 35 degree in step S18.

If the internal temperature of the equipment body is equal to or more than 35 degree in step S14 and step S18, the flow is shifted to step S19 and a high speed rotation setting is performed in step S19. More specifically, with respect to the sub micom 4 for a high rotation condition, the CPU 1 makes the first fan control terminal FAN_CONT1 be a high-level (High), the second fan control terminal FAN_CONT2 be a high-level (High) and the fan switching control terminal FAN2_SW be a high-level (High), all of which are controlled by a fan control program. In this way, the supply of the 12V-system-drive power supply voltage with respect to the first fan (FAN 1) 7 and the second fan (FAN 2) 8 from the power supply board 5 and the relay board 6 is performed by a voltage value or a duty of a pulse width which corresponds to the high speed rotation setting, so that both the first fan (FAN 1) 7 and the second fan (FAN 2) 8 becomes a high speed rotating state.

In this way, when the internal temperature becomes equal to or more than 35° C., the first fan (FAN 1) 7 and the second fan (FAN 2) 8 is made rotated in a high speed and the inside is cooled such that the internal temperature can be cooled equal to or less than 35° C. which is the guarantee temperature of the used device.

It is judged in step S20 whether or not the internal temperature of the equipment body is equal to or more than 55 degree. More specifically, the CPU 1 judges with respect to the sub micom 4 whether or not the temperature value detected by the temperature sensor 9 is equal to or more than 55 degree.

In step S20, when the internal temperature of the equipment body is not equal to nor more than 55 degree, the flow is shifted to step S21 and it is judged in step S21 whether or not the internal temperature of the equipment body is equal to or more than 35 degree. More specifically, with respect to the sub micom 4, the CPU 1 judges whether or not the temperature value detected by the temperature sensor 9 is equal to or more than 35 degree. Here, 35° C. is a guarantee temperature of the used device.

If the internal temperature of the equipment body is not equal to nor less than 35 degree in step S21, the flow returns to step S20 and repeats the judgment whether or not the internal temperature of the equipment body is equal to or more than 55 degree in step S20 and the judgment whether or not the internal temperature of the equipment body is equal to or less than 35 degree in step S21.

If the internal temperature of the equipment body is equal to or less than 35 degree in step S21, the flow returns to step S16 and repeats the low rotation setting in step S16, the judgment whether or not the internal temperature of the equipment body is equal to or more than 55 degree in step S17 and the judgment whether or not the internal temperature of the equipment body is equal to or more than 35 degree in step S18 and further repeats the high rotation setting in step S19, the judgment whether or not the internal temperature of the equipment body is equal to or more than 55 degree in step S20 and the judgment whether or not the internal temperature of the equipment body is equal to or less than 35 degree in step S21.

If the internal temperature of the equipment body is equal to or more than 55 degree in step S13, step S17 or step S20, the flow is shifted to step S22 and an emergency process is performed in step S22. More specifically, as the CPU 1 considers with respect to sub micom 4 that 55° C. is abnormal for the internal temperature, it is designed, for example, that the CPU 1 performs by its state control function an emergency process by controlling such that it is shifted from the power-on state to the power-off state.

In this way, the CPU 1 makes the sub micom 4 observe the temperature by using the feedback of the temperature value to both the CPU 1 and the sub micom 4 by means of the temperature sensor 9 such that a high speed rotation response of the first fan (FAN 1) 7 and the second fan (FAN 2) 8 when the temperature rises and also an emergency response at an abnormally high temperature (equal to or more than 55 degree) can be performed.

In this way, an effect can be obtained such that the equipment having a network connecting function is made quiet at the polling time and the power consumption is reduced by stopping the fan when the power supply is made on.

Figure 4:
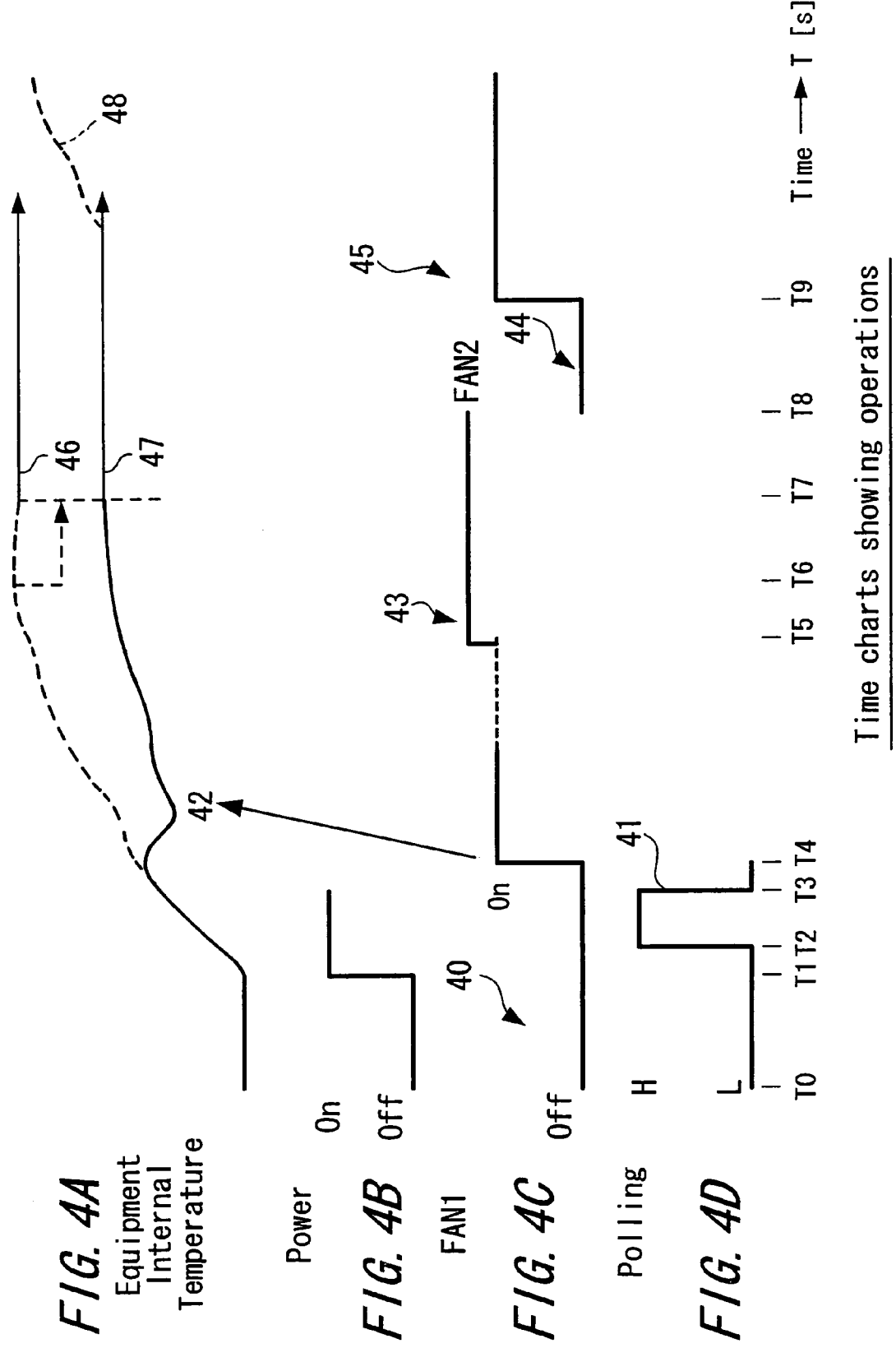
FIGS. 4 are time charts showing operations where

FIGS. 4 are time charts showing operations where FIG. 4A shows the internal temperature of the equipment body, FIG. 4B shows the power state of the equipment body, FIG. 4C shows the operation of a first fan (FAN 1) 7 and a second fan (FAN 2) 8, and FIG. 4D shows a polling operation.

In FIGS. 4, the equipment body is a power-off state from T0 to T1. For the program reservation data and program transfer 41 according to the polling operation shown as T1 to T4 (includes from T2 to T3) in FIG. 4D, the equipment body is shifted to an on-state after T1. This operation corresponds to the power-on state shown as step S11 in FIG. 3.

Practically, communication is performed between the equipment body and the server before and after the program reservation data and program transfer 41 (from T2 to T3) for recognition (from T1 to T2) for the transmission and affirmation (from T3 to T4) after transferred with respect to the server by the equipment body.

The operation of the first fan (FAN 1) 7 and the second fan (FAN 2) 8 shown in FIG. 4C becomes from T0 to T4 such that the equipment body shown in FIG. 4B is in a power-off state from T0 to T1 and is in a quiet state 40 from T1 to T4 during the polling by the polling operation shown in FIG. 4D. The duration from T1 to T4 corresponds, for example, to 5 minutes. This operation corresponds to the stop-setting shown as step S12 with reference to FIG. 3 and the judgment shown as step S15 whether or not 5 minutes have elapsed since the equipment body was shifted to power-on state.

The operation of the first fan (FAN 1) 7 shown in FIG. 4C becomes ON from T4 to T5 and performs a low speed rotate operation. This operation corresponds to the low speed rotation setting shown as step S16 in FIG. 3.

The internal temperature of the equipment body shown in FIG. 4A rapidly increases by the off-operation of the first fan (FAN 1) 7 and the second fan (FAN 2) 8 shown in FIG. 4C according to the polling operation from T1 to T4 shown in FIG. 4D, but it does not reach the saturation temperature 46 and once it decreases and thereafter moderately increases as shown as 42 owing to the on-operation of the first fan (FAN 1) 7 at the T4 time point shown in FIG. 4C. At the T6 time point, the temperature appears as the saturation temperature 46 if there is no fan operation.

Also by the on operation of the first fan (FAN 1) 7 at the T4 time point shown in FIG. 4C, the internal temperature of the equipment body is to reach, at the T7 time point, the saturation temperature 47 which is one when there is a fan operation. At the T7 time point, the temperature appears as the saturation temperature 47 if there is a fan operation.

Here, it is assumed that there is little influence to the temperature rise by stopping the fan for a short period at the starting time. The reason thereof is because the time until the temperature in the equipment saturates is very long such that there is no influence of stopping the fan in a short period at the starting time.

Consequently, by the on-operation of the first fan (FAN 1) 7 and the second fan (FAN 2) 8 from T5 to T8 shown in FIG. 4C, a high speed rotation is adopted at the high temperature so as to decrease the temperature as shown as 43. This operation corresponds to the high speed rotation setting shown as step S19 in FIG. 3.

This operation corresponds to a case of shifting to a low speed rotation setting as shown as step S16 when it is judged that the internal temperature of the equipment body is equal to or more than 35 degree in step S21 in FIG. 3.

By the on-operation of the first fan (FAN 1) 7 after T9 shown in FIG. 4C, a low speed rotation is adopted at the high temperature so as to decrease the temperature as shown as 45. This operation corresponds to the low speed rotation setting shown as step S16 in FIG. 3.

Next, it will be explained about a second exemplified embodiment of the present invention.

In the fan control system applied with the second exemplified embodiment, it is constituted such that the CPU 1 changes the value of the definite duration for stopping the operation of the first fan (FAN 1) 7 and the second fan (FAN 2) 8 responsive to the absolute time according to the time control function thereof.

Figure 5:
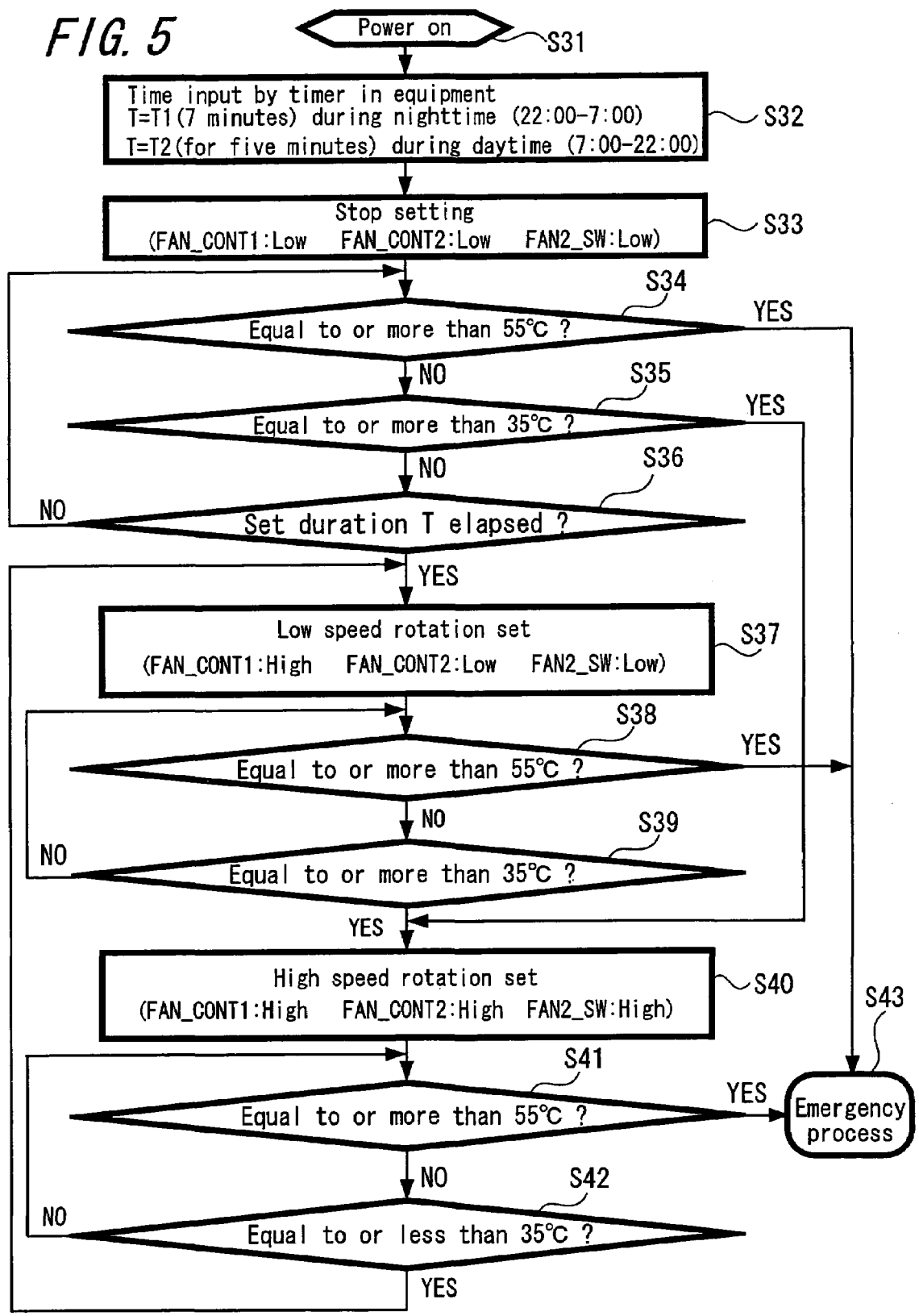
FIG. 5 is a flowchart showing a fan control operation using a timer.

FIG. 5 is a flowchart showing a fan control operation utilizing a timer. FIG. 5 shows a fan control operation after the main body is shifted to a power-on state in step S4 shown in FIG. 2.

The equipment body is shifted to a power-on state in step S31. More specifically, in step S4 shown in FIG. 2, the CPU 1 controls by its state control function so as to shift from the standby state to the power-on state when the timer-reserved-time set by the timer reservation 12 comes.

In step S32, time is input by the inside timer of the equipment. More specifically, a certain timer-reserved time which is the time corresponding to the absolute time for starting after stopping the fan operation with respect to the CPU 1 by the timer reservation 12 is made set. For example, the set time is made as T=T1 (7 minutes) during the nighttime (22:00-7:00) and as T=T2 (for five minutes ) during the daytime (7:00-22:00).

For example, it becomes possible according to the time to make the fan stop period as 7 minutes during the nighttime (22:00-7:00) and as five minutes during the daytime (7:00-22:00) and it is possible to change the set time for the fan stop responsive to the absolute time.

In step S33, a stop setting is performed. More specifically, the CPU 1 with respect to the sub micom 4 makes, as the stop condition, the first fan control terminal FAN_CONT1 to be low-level (Low), the second fan control terminal FAN_CONT2 to be low-level (Low) and the fan switching control terminal FAN2_SW to be low-level (Low), all of which are controlled by the fan control program. In this way, the supply of the power supply voltage of the 12V-system-drive from the power supply board 5 and the relay board 6 to the first fan (FAN 1) 7 and the second fan (FAN 2) 8 is stopped, so that both of the first fan (FAN 1) 7 and the second fan (FAN 2) 8 become the stop state.

It is judged in step S34 whether or not the internal temperature of the equipment body is equal to or more than 55 degree. More specifically, CPU 1 judges with respect to the sub micom 4 whether or not the temperature value detected by the temperature sensor 9 is equal to or more than 55 degree.

In this way, if the temperature is made preferential for controlling as in the conventional technology, it is possible neither to stop the fan for 5 minutes at the starting time nor at the same time to set the stop period constant. On the other hand, according to the exemplified embodiment of the present invention, the CPU 1 makes the sub micom 4 measure the temperature inside o f the equipment using the temperature sensor 9, observe the state using the rotation detecting terminal FAN_PULSE 1 and FAN_PULSE 2 by making the first fan (FAN 1) 7 and the second fan (FAN 2) 8 generate pulses corresponding to the rotational frequency thereof and at the same time perform the control of the supply of the 12V-system-drive power supply voltage with respect to the first fan (FAN 1) 7 and the second fan (FAN 2) 8.

If the internal temperature of the equipment body is not equal to nor more than 55 degree in step S34, the flow shifts to step S35 and it is judged in step S35 whether or not the internal temperature of the equipment body is equal to or more than 35 degree. More specifically, the CPU 1 judges with respect to the sub micom 4 whether or not the temperature value detected by temperature sensor 9 is equal to or more than 35 degree. Here, 35° C. is a guarantee temperature of the used device.

If the internal temperature of the equipment body is not equal to nor more than 35 degree in step S35, the flow shifts to step S36 and it is judged in step S36 whether or not T minutes elapsed after the equipment body was shifted to power-on state. More specifically, the CPU 1 judges as a time control function whether or not a value of a definite duration, that is, herein T minutes which was inputted in step S32 elapsed. It should be noted that it is possible for users to set the definite duration according to the absolute time by the timer reservation 12 with respect to the CPU 1 such as to correspond to the time when the CPU 1 finishes the polling communication with the server 11. Additionally, it is possible to set the definite duration value such as to correspond to the time when the CPU 1 finishes the polling communication with the server 11 by sampling a plurality of polling periods.

In this way, when the polling is performed and the program reservation data are transferred during the fan stop period after the equipment is activated, the stop period is changed by the time at the starting time according to the second exemplified embodiment. For example, the fan stop period can be prolonged during the nighttime, because the temperature in the equipment is low, so that the data transfer can be performed definitely. Alternately, the temperature in the equipment becomes high during the daytime, because the equipment is often in use. For this reason, the stop period is made shorter and the temperature rise can be suppressed.

If, in shift step S36, T minutes do not elapse after the equipment body is shifted to the power-on state, the flow returns to step S34, and the judgment in step S34 whether or not the internal temperature of the equipment body is equal to or more than 55 degree, the judgment in step S35 whether or not the internal temperature of the equipment body is equal to or more than 35 degree and the judgment in step S36 whether or not T minutes elapsed after the equipment body is shifted to a power-on state will repeat.

In this way, since the polling period is short as for around T minutes after the starting time, the fan operation is made stopped for a definite duration even when the state is shifted from a standby state to a power-on state of the polling start by controlling as a time axis control the first fan (FAN 1) 7 and the second fan (FAN 2) 8 to stop during that period such that quietness is maintained at the polling time so as to improve the ambient noise quality and to reduce the power consumption.

When T minutes elapsed after the equipment body was shifted to a power-on state instep S36, the flow is shifted to step S37, and a low speed rotation setting is performed in step S37. More specifically, with respect to the sub micom 4 for a stop condition, the CPU 1 makes the first fan control terminal FAN_CONT1 be a high-level (High), the second fan control terminal FAN_CONT2 be a low-level (Low) and the fan switching control terminal FAN2_SW be a low-level (Low), all of which are controlled by a fan control program. In this way, the supply of the 12V-system-drive power supply voltage from the power supply board 5 to the first fan (FAN 1) 7 is performed by a voltage value or a duty of a pulse width which corresponds to the low speed rotation setting, so that only the first fan (FAN 1) 7 becomes a low speed rotating state.

In this way, with respect to the sub micom 4, the CPU 1 sets the drive voltage or the pulse-width duty low after T minutes from the starting time so as to rotate the first fan (FAN 1) 7 in a low speed and when the first fan (FAN 1) 7 and the second fan (FAN 2) 8 are stopped at the starting time, it is made such that the temperature rises but it does not rise to saturation degree owing to the short period, so that it is possible to maintain quietness at the polling end so as to improve the ambient noise quality and to reduce the power consumption.

It is judged in step S38 whether or not the internal temperature of the equipment body is equal to or more than 55 degree. More specifically, with respect to sub micom 4, CPU 1 judged whether or not the temperature value detected by the temperature sensor 9 is equal to or more than 55 degree.

In step S38, when the internal temperature of the equipment body is not equal to nor more than 55 degree, the flow is shifted to step S39 and it is judged in step S39 whether or not the internal temperature of the equipment body is equal to or more than 35 degree. More specifically, with respect to the sub micom 4, the CPU 1 judges whether or not the temperature value detected by the temperature sensor 9 is equal to or more than 35 degree.

If the internal temperature of the equipment body is not equal to nor more than 35 degree in step S39, the flow returns to step S38 and repeats the judgment whether or not the internal temperature of the equipment body is equal to or more than 55 degree in step S38 and the judgment whether or not the internal temperature of the equipment body is equal to or more than 35 degree in step S39.

If the internal temperature of the equipment body is equal to or more than 35 degree in step S35 and step S39, the flow is shifted to step S40 and a high speed rotation setting is performed in step S40. More specifically, with respect to the sub micom 4 for a high rotation condition, the CPU 1 makes the first fan control terminal FAN_CONT1 be a high-level (High), the second fan control terminal FAN_CONT2 be a high-level (High) and the fan switching control terminal FAN2_SW be a high-level (High), all of which are controlled by a fan control program. In this way, the supply of the 12V-system-drive power supply voltage from the power supply board 5 and the relay board 6 to the first fan (FAN 1) 7 and the second fan (FAN 2) 8 is performed by a voltage value or a duty of a pulse width which corresponds to the high speed rotation setting, so that both the first fan (FAN 1) 7 and the second fan (FAN 2) 8 becomes a high speed rotating state.

In this way, when the internal temperature becomes equal to or more than 35° C., the first fan (FAN 1) 7 and the second fan (FAN 2) 8 are made rotated in a high speed and the inside is cooled such that the internal temperature can be cooled equal to or less than 35° C. which is the guarantee temperature of the used device.

It is judged in step S41 whether or not the internal temperature of the equipment body is equal to or more than 55 degree. More specifically, the CPU 1 judges with respect to the sub micom 4 whether or not the temperature value detected by the temperature sensor 9 is equal to or more than 55 degree.

In step S41, when the internal temperature of the equipment body is not equal to nor more than 55 degree, the flow is shifted to step S42 and it is judged in step S42 whether or not the internal temperature of the equipment body is equal to or more than 35 degree. More specifically, with respect to the sub micom 4, the CPU 1 judges whether or not the temperature value detected by the temperature sensor 9 is equal to or more than 35 degree. Here, 35° C. is a guarantee temperature of the used device.

If the internal temperature of the equipment body is not equal to nor less than 35 degree in step S42, the flow returns to step S41 and repeats the judgment whether or not the internal temperature of the equipment body is equal to or more than 55 degree in step S41 and the judgment whether or not the internal temperature of the equipment body is equal to or less than 35 degree in step S42.

If the internal temperature of the equipment body is equal to or less than 35 degree in step S42, the flow returns to step S37 and repeats the low rotation setting in step S37, the judgment whether or not the internal temperature of the equipment body is equal to or more than 55 degree in step S38 and the judgment whether or not the internal temperature of the equipment body is equal to or more than 35 degree in step S39 and further repeats the high rotation setting in step S40, the judgment whether or not the internal temperature of the equipment body is equal to or more than 55 degree in step S41 and the judgment whether or not the internal temperature of the equipment body is equal to or less than 35 degree in step S42.

If the internal temperature of the equipment body is equal to or more than 55 degree in step S34, step S38 or step S41, the flow is shifted to step S43 and an emergency process is performed in step S43. More specifically, it is designed that the emergency process is performed by the CPU 1 with respect to sub micom 4 as 55° C. is considered to be abnormal for the internal temperature, for example, to control as its state control function such that it is shifted from the power-on state to the power-off state.

In this way, the CPU 1 makes the sub micom 4 observe the temperature by using the feedback of the temperature value to both the CPU 1 and the sub micom 4 by means of the temperature sensor 9 such that a high speed rotation response of the first fan (FAN 1) 7 and the second fan (FAN 2) 8 when the temperature rises and also an emergency response at an abnormally high temperature (equal to or more than 55 degree) can be performed.

In this way, by changing the value of the definite duration for stopping the operation of the first fan (FAN 1) 7 and the second fan (FAN 2) 8 responsive to the absolute time, an effect can be obtained such that the equipment having a network connecting function is made quiet at the polling time and the power consumption is reduced by stopping the fan when the power supply is made on.

Next, it will be explained about a third exemplified embodiment of the present invention.

In the fan control system applied with the third exemplified embodiment, it is constituted such that it is provided with control means where the CPU 1 controls the stop of the operation of the first fan (FAN 1) 7 and the second fan (FAN 2) 8 in response to the operation mode of the equipment body.

Figure 7:
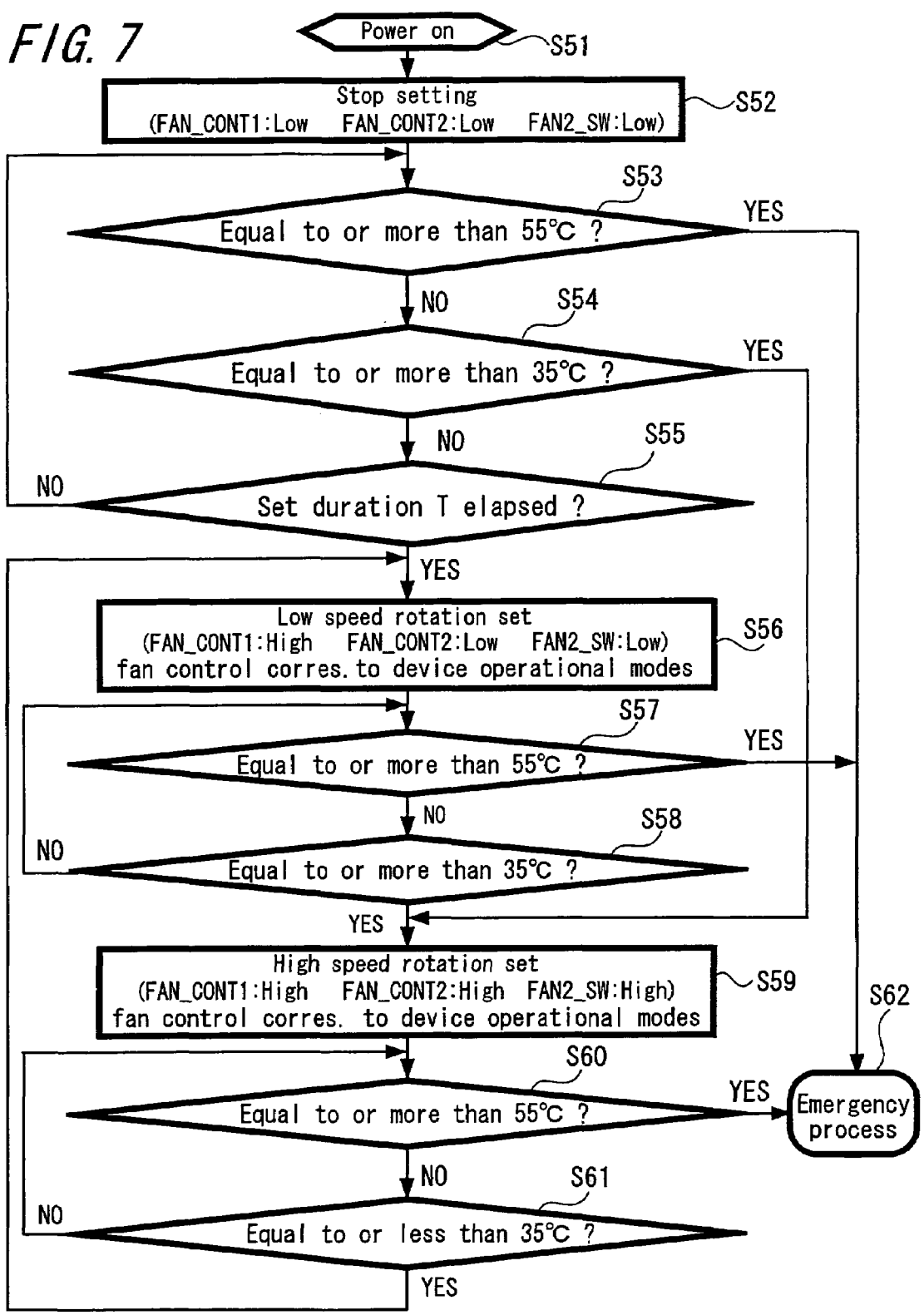
FIG. 7 is a flowchart showing a fan control operation corresponding to operational modes.

FIG. 7 is a flowchart showing a fan control operation corresponding to operational modes. FIG. 7 shows a fan control operation after the main body is shifted to a power-on state in step S4 shown in FIG. 2.

The equipment body is shifted to a power-on state in step S51. More specifically, in step S4 shown in FIG. 2, the CPU 1 controls by its state control function so as to shift from the standby state to the power-on state when the timer-reserved-time set by the timer reservation 12 comes.

In step S52, a stop setting is performed. More specifically, with respect to the sub micom 4 for a stop condition, the CPU 1 makes the first fan control terminal FAN_CONT1 be a low-level (Low), the second fan control terminal FAN_CONT2 be a low-level (Low) and the fan switching control terminal FAN2_SW be a low-level (Low), all of which are controlled by a fan control program. In this way, the supply of the 12V-system-drive power supply voltage from the power supply board 5 and the relay board 6 to the first fan (FAN 1) 7 and the second fan (FAN 2) 8 is stopped, so that both of the first fan (FAN 1) 7 and the second fan (FAN 2) 8 become in a stop state.

In step S53, it is judged whether or not the internal temperature of the equipment body is equal to or more than 55 degree. More specifically, the CPU 1 judges with respect to the sub micom whether or not the temperature value detected by the temperature sensor 9 is equal to or more than 55 degree.

In this way, if the temperature is made preferential for controlling as in the conventional technology, it is possible neither to stop the fan for 5 minutes at the starting time nor at the same time to set the stop period constant. On the other hand, according to the exemplified embodiment of the present invention, with respect to the sub micom 4, the CPU 1 makes it measure the internal temperature of the equipment by the temperature sensor 9, makes it observe the state by directing the first fan (FAN 1) 7 and the second fan (FAN 2) 8 to generate pulses corresponding to the rotational frequency and by using the rotation detecting terminals FAN_PULSE 1 and FAN_PULSE 2 and at the same time makes it control the supply of the 12V-system-drive power supply voltage for the first fan (FAN 1) 7 and the second fan (FAN 2) 8.

In step S53, when the internal temperature of the equipment body is not equal to nor more than 55 degree, the flow is shifted to step S54 and it is judged in step S54 whether or not the internal temperature of the equipment body is equal to or more than 35 degree. More specifically, with respect to the sub micom 4, the CPU 1 judges whether or not the temperature value detected by the temperature sensor 9 is equal to or more than 35 degree. Here, 35° C. is a guarantee temperature of the used device.

In step S54, when the internal temperature of the equipment body is not equal to nor more than 35 degree, the flow is shifted to step S55 and it is judged in step S55 whether or not T minutes have elapsed since the equipment body is shifted to a power-on state. More specifically, the CPU 1 judges by its time control function whether or not a definite duration, that is here, 5 minutes or the set time corresponding to the absolute time shown in the aforementioned second exemplified embodiment has elapsed. It should be noted that it is possible for users to set the definite duration by the timer reservation 12 with respect to the CPU 1 such as to correspond to the time when the CPU 1 finishes the polling communication with the server 11. Additionally, it is possible to set the definite duration value such as to correspond to the time when the CPU 1 finishes the polling communication with the server 11 by sampling a plurality of polling periods.

If it does not elapse T minutes after the equipment body is shifted to a power-on state in step S55, the flow returns to step S53 and repeats the judgment whether or not the internal temperature of the equipment body is equal to or more than 55 degree in step S53, the judgment whether or not the internal temperature of the equipment body is equal to or more than 35 degree in step S54 and the judgment whether or not T minutes elapsed after the equipment body was shifted to a power-on state in step S55.

In this way, since the polling period is short as for around T minutes after the starting time, the fan operation is made stopped for a definite duration even when the state is shifted from a standby state to a power-on state of the polling start by controlling as a time axis control the first fan (FAN 1) 7 and the second fan (FAN 2) 8 to stop during that period such that quietness is maintained at the polling time so as to improve the ambient noise quality and to reduce the power consumption.

When T minutes elapsed after the equipment body was shifted to a power-on state instep S55, the flow is shifted to step S56, and a low speed rotation setting is performed in step S56. More specifically, with respect to the sub micom 4 for a stop condition, the CPU 1 makes the first fan control terminal FAN_CONT1 be a high-level (High), the second fan control terminal FAN_CONT2 be a low-level (Low) and the fan switching control terminal FAN2_SW be a low-level (Low), all of which are controlled by a fan control program. In this way, the supply of the 12V-system-drive power supply voltage from the power supply board 5 to the first fan (FAN 1) 7 is performed by a voltage value or a duty of a pulse width which corresponds to the low speed rotation setting, so that only the first fan (FAN 1) 7 becomes a low speed rotating state.

In this way, with respect to the sub micom 4, the CPU 1 sets the drive voltage or the pulse-width duty low after T minutes from the starting time so as to rotate the first fan (FAN 1) 7 in a low speed and when the first fan (FAN 1) 7 and the second fan (FAN 2) 8 are stopped at the starting time, it is made such that the temperature rises but it does not rise to saturation degree owing to the short period, so that it is possible to maintain quietness at the polling end so as to improve the ambient noise quality and to reduce the power consumption.

Here, when the low speed rotation is performed by means of the first fan (FAN 1) 7, it is designed such that the fan control is performed corresponding to the operation mode.

FIG. 6 is a diagram showing a fan control corresponding to operational modes. In FIG. 6, HDD 62 is in a standby state and DVD-RW 63 is in a stop state under a first of an operation mode 61 and at this time the CPU 1 controls with respect to the sub micom 4 such that the fan control (effective rotational frequency) 64 becomes 60% of the set rotational frequency.

Next, HDD 62 is in a standby state and DVD-RW 63 is in a reproduction state under a second of the operation mode 61 and at this time the CPU 1 controls with respect to the sub micom 4 such that the fan control (effective rotational frequency) 64 becomes 70% of the set rotational frequency.

Next, HDD 62 is in a record state and DVD-RW 63 is in a stop state under a third of the operation mode 61 and at this time the CPU 1 controls with respect to the sub micom 4 such that the fan control (effective rotational frequency) 64 becomes 80% of the set rotational frequency.

Next, HDD 62 is in a record state and DVD-RW 63 is in a reproduction state under a fourth of the operation mode 61 and at this time the CPU 1 controls with respect to the sub micom 4 such that the fan control (effective rotational frequency) 64 becomes 90% of the set rotational frequency.

Then, HDD 62 is in a reproduction state and DVD-RW 63 is in a record state under a fifth of the operation mode 61 and at this time the CPU 1 controls with respect to the sub micom 4 such that the fan control (effective rotational frequency) 64 becomes 100% of the set rotational frequency.

In this manner, by performing the fan control in response to the device operation mode, the total power consumption varies in accordance with the operation mode of the device which is used in the equipment, so that it is possible in the third exemplified embodiment to realize the rotational noise reduction of the fan and the reduction of the power consumption by performing a control according to the device operation mode in the closed loop by the temperature sensor more minutely, and for example, it is possible to control minutely by changing the ratio of the effective rotational frequency with respect to the fan rotational frequency which is set by assuming the power consumption according to the combination of the above mentioned device operation modes.

In step S57, it is judged whether or not the internal temperature of the equipment body is equal to or more than 55 degree. More specifically, the CPU 1 judges with respect to the sub micom whether or not the temperature value detected by the temperature sensor 9 is equal to or more than 55 degree.

In step S57, when the internal temperature of the equipment body is not equal to nor more than 55 degree, the flow is shifted to step S58 and it is judged in step S58 whether or not the internal temperature of the equipment body is equal to or more than 35 degree. More specifically, with respect to the sub micom 4, the CPU 1 judges whether or not the temperature value detected by the temperature sensor 9 is equal to or more than 35 degree.

If the internal temperature of the equipment body is not equal to nor more than 35 degree in step S58, the flow returns to step S57 and repeats the judgment whether or not the internal temperature of the equipment body is equal to or more than 55 degree in step S57 and the judgment whether or not the internal temperature of the equipment body is equal to or more than 35 degree in step S58.

If the internal temperature of the equipment body is equal to or more than 35 degree in step S54 and step S58, the flow is shifted to step S59 and a high speed rotation setting is performed in step S59. More specifically, with respect to the sub micom 4 for a high rotation condition, the CPU 1 makes the first fan control terminal FAN_CONT1 be a high-level (High), the second fan control terminal FAN_CONT2 be a high-level (High) and the fan switching control terminal FAN2_SW be a high-level (High), all of which are controlled by a fan control program. In this way, the supply of the 12V-system-drive power supply voltage from the power supply board 5 and the relay board 6 to the first fan (FAN 1) 7 and the second fan (FAN 2) 8 is performed by a voltage value or a duty of a pulse width which corresponds to the high speed rotation setting, so that both the first fan (FAN 1) 7 and the second fan (FAN 2) 8 becomes a high speed rotating state.

In this way, when the internal temperature becomes equal to or more than 35° C., the first fan (FAN 1) 7 and the second fan (FAN 2) 8 is made rotated in a high speed and the inside is cooled such that the internal temperature can be cooled equal to or less than 35° C. which is the guarantee temperature of the used device.

Here, when the high speed rotation is performed by means of the first fan (FAN 1) 7 and the second fan (FAN 2) 8, it is designed such that the fan control is performed corresponding to the operation mode.

It is judged in step S60 whether or not the internal temperature of the equipment body is equal to or more than 55 degree. More specifically, with respect to sub micom 4, CPU 1 judged whether or not the temperature value detected by the temperature sensor 9 is equal to or more than 55 degree.

In step S60, when the internal temperature of the equipment body is not equal to nor more than 55 degree, the flow is shifted to step S61 and it is judged in step S61 whether or not the internal temperature of the equipment body is equal to or more than 35 degree. More specifically, with respect to the sub micom 4, the CPU 1 judges whether or not the temperature value detected by the temperature sensor 9 is equal to or more than 35 degree.

If the internal temperature of the equipment body is not equal to nor more than 35 degree in step S61, the flow returns to step S60 and repeats the judgment whether or not the internal temperature of the equipment body is equal to or more than 55 degree in step S60 and the judgment whether or not the internal temperature of the equipment body is equal to or more than 35 degree in step S61.

If the internal temperature of the equipment body is equal to or less than 35 degree in step S61, the flow returns to step S56 and repeats the low rotation setting in step S56, the judgment whether or not the internal temperature of the equipment body is equal to or more than 55 degree in step S57 and the judgment whether or not the internal temperature of the equipment body is equal to or more than 35 degree in step S58 and further repeats the high rotation setting in step S59, the judgment whether or not the internal temperature of the equipment body is equal to or more than 55 degree in step S60 and the judgment whether or not the internal temperature of the equipment body is equal to or less than 35 degree in step S61.

If the internal temperature of the equipment body is equal to or more than 55 degree in step S53, step S57 or step S60, the flow is shifted to step S62 and an emergency process is performed in step S62. More specifically, it is designed that the emergency process is performed by the CPU 1 with respect to sub micom 4 as 55° C. is considered to be abnormal for the internal temperature, for example, to control as its state control function such that it is shifted from the power-on state to the power-off state.

In this way, the CPU 1 makes the sub micom 4 observe the temperature by using the feedback of the temperature value to both the CPU 1 and the sub micom 4 by means of the temperature sensor 9 such that a high speed rotation response of the first fan (FAN 1) 7 and the second fan (FAN 2) 8 when the temperature rises and also an emergency response at an abnormally high temperature (equal to or more than 55 degree) can be performed.

In this way, by performing a fan control in response to the operation mode, an effect can be obtained such that the equipment having a network connecting function is made quiet at the polling time and the power consumption is reduced by stopping the fan when the power supply is made ON.

Next, it will be explained about a fourth exemplified embodiment of the present invention.

In the fan control system applied with the fourth exemplified embodiment, it is constituted such that it is provided with ramp-shaped rising control means where the CPU 1 controls the rotational frequency of the first fan (FAN 1) 7 and the second fan (FAN 2) 8 to rise in a ramp-shape.

Figure 8:
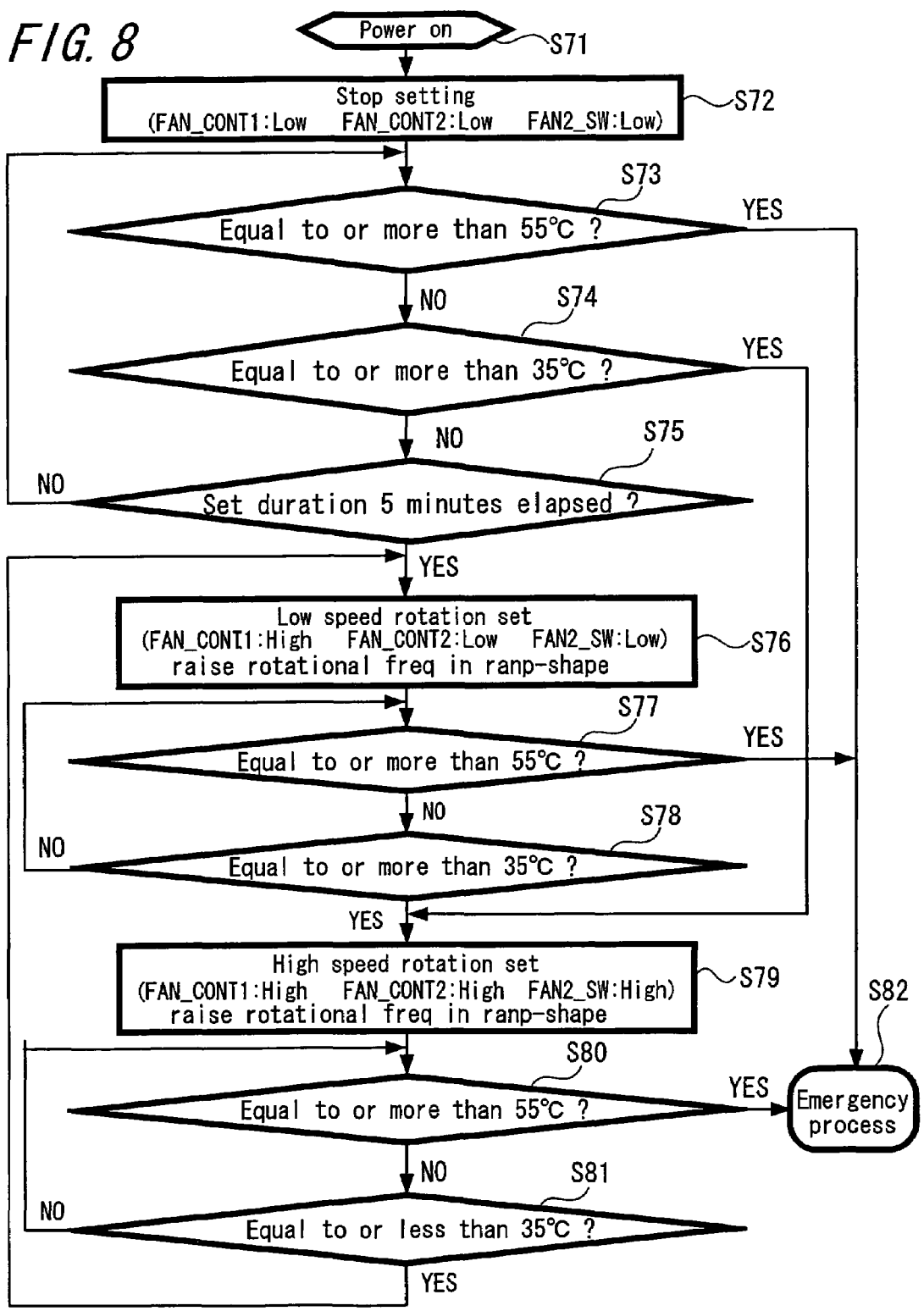
FIG. 8 is a flowchart showing a fan control operation where a rotational frequency has a ramp-shaped rising.

FIG. 8 is a flowchart showing a fan control operation where a rotational frequency has a ramp-shaped rising. FIG. 8 is a flowchart showing a fan control operation corresponding to operational modes. FIG. 8 shows a fan control operation after the main body is shifted to a power-on state in step S4 shown in FIG. 2.

The equipment body is shifted to a power-on state in step S71. More specifically, in step S4 shown in FIG. 2, the CPU 1 controls by its state control function so as to shift from the standby state to the power-on state when the timer-reserved-time set by the timer reservation 12 comes.

In step S72, a stop setting is performed. More specifically, with respect to the sub micom 4 for a stop condition, the CPU 1 makes the first fan control terminal FAN_CONT1 be a low-level (Low), the second fan control terminal FAN_CONT2 be a low-level (Low) and the fan switching control terminal FAN2_SW be a low-level (Low), all of which are controlled by a fan control program. In this way, the supply of the 12V-system-drive power supply voltage from the power supply board 5 and the relay board 6 to the first fan (FAN 1) 7 and the second fan (FAN 2) 8 is stopped, so that both of the first fan (FAN 1) 7 and the second fan (FAN 2) 8 become in a stop state.

In step S73, it is judged whether or not the internal temperature of the equipment body is equal to or more than 55 degree. More specifically, the CPU 1 judges with respect to the sub micom whether or not the temperature value detected by the temperature sensor 9 is equal to or more than 55 degree.

If the temperature is made preferential for controlling as in the conventional technology, it is possible neither to stop the fan for 5 minutes at the starting time nor at the same time to set the stop period constant. On the other hand, according to the exemplified embodiment of the present invention, with respect to the sub micom 4, the CPU 1 makes it measure the internal temperature of the equipment by the temperature sensor 9, makes it observe the state by directing the first fan (FAN 1) 7 and the second fan (FAN 2) 8 to generate pulses corresponding to the rotational frequency and by using the rotation detecting terminals FAN_PULSE 1 and FAN_PULSE 2 and at the same time makes it control the supply of the 12V-system-drive power supply voltage for the first fan (FAN 1) 7 and the second fan (FAN 2) 8.

In step S73, when the internal temperature of the equipment body is not equal to nor more than 55 degree, the flow is shifted to step S74 and it is judged in step S74 whether or not the internal temperature of the equipment body is equal to or more than 35 degree. More specifically, with respect to the sub micom 4, the CPU 1 judges whether or not the temperature value detected by the temperature sensor 9 is equal to or more than 35 degree. Here, 35° C. is a guarantee temperature of the used device.

In step S74, when the internal temperature of the equipment body is not equal to nor more than 35 degree, the flow is shifted to step S75 and it is judged in step S75 whether or not 5 minutes have elapsed since the equipment body is shifted to a power-on state. More specifically, the CPU 1 judges by its time control function whether or not a definite duration, that is here, 5 minutes has elapsed. It should be noted that it is possible for users to set the definite duration by the timer reservation 12 with respect to the CPU 1 such as to correspond to the time when the CPU 1 finishes the polling communication with the server 11. Additionally, it is possible to set the definite duration value such as to correspond to the time when the CPU 1 finishes the polling communication with the server 11 by sampling a plurality of polling periods.

If it does not elapse 5 minutes after the equipment body is shifted to a power-on state in step S75, the flow returns to step S73 and repeats the judgment whether or not the internal temperature of the equipment body is equal to or more than 55 degree in step S73, the judgment whether or not the internal temperature of the equipment body is equal to or more than 35 degree in step S74 and the judgment whether or not T minutes elapsed after the equipment body was shifted to a power-on state in step S75.

In this way, since the polling period is short as for around 5 minutes after the starting time, the fan operation is made stopped for a definite duration even when the state is shifted from a standby state to a power-on state of the polling start by controlling as a time axis control the first fan (FAN 1) 7 and the second fan (FAN 2) 8 to stop during that period such that quietness is maintained at the polling time so as to improve the ambient noise quality and to reduce the power consumption.

When 5 minutes elapsed after the equipment body was shifted to a power-on state instep S75, the flow is shifted to step S76, and a low speed rotation setting is performed in step S76. More specifically, with respect to the sub micom 4 for a stop condition, the CPU 1 makes the first fan control terminal FAN_CONT1 be a high-level (High), the second fan control terminal FAN_CONT2 be a low-level (Low) and the fan switching control terminal FAN2_SW be a low-level (Low), all of which are controlled by a fan control program. In this way, the supply of the 12V-system-drive power supply voltage from the power supply board 5 to the first fan (FAN 1) 7 is performed by a voltage value or a duty of a pulse width which corresponds to the low speed rotation setting, so that only the first fan (FAN 1) 7 becomes a low speed rotating state.

In this way, with respect to the sub micom 4, the CPU 1 sets the drive voltage or the pulse-width duty low after 5 minutes from the starting time so as to rotate the first fan (FAN 1) 7 in a low speed and when the first fan (FAN 1) 7 and the second fan (FAN 2) 8 are stopped at the starting time, it is made such that the temperature rises but it does not rise to saturation degree owing to the short period, so that it is possible to maintain quietness at the polling end so as to improve the ambient noise quality and to reduce the power consumption.

Here, when the low speed rotation is performed by means of the first fan (FAN 1) 7, it is designed such that the rotational frequency is controlled to rise in a ramp-shape.

Figure 9:
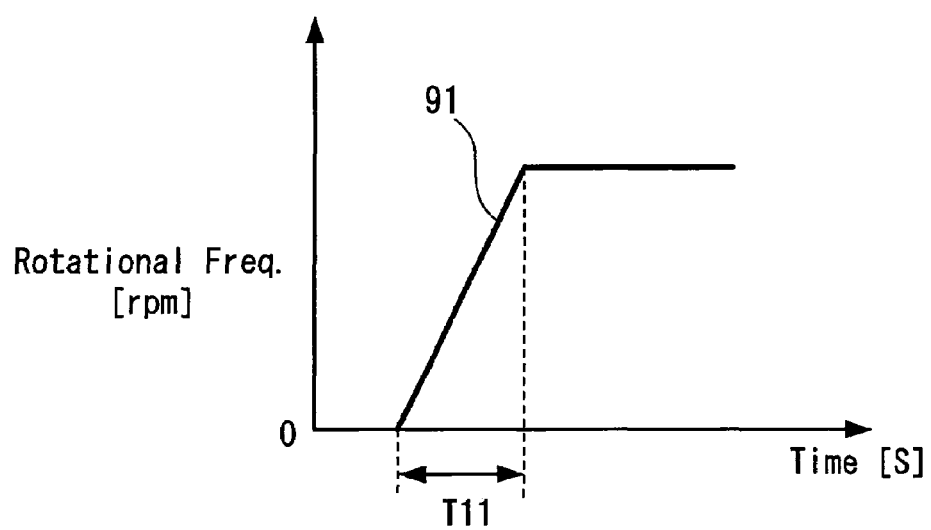
FIG. 9 is a diagram showing the ramp-shaped rising of the rotational frequency.

FIG. 9 is a diagram showing the ramp-shaped rising of the rotational frequency. In FIG. 9, when the CPU 1 makes the sub micom 4 perform the high speed rotation by means of the first fan (FAN 1) 7, it is designed such that the rotational frequency is controlled to rise in a ramp-shape during a duration of a period T11 as shown as 91.

In this manner, by controlling the ramp-shaped rising edge of the fan rotational frequency, it is possible to reduce rotational noises for the auditory sense when the low and high speed rotations of the fan are set, and more specifically, by controlling the rotational frequency to increase gradually to a certain level in several 10 seconds, the auditory sense will get accustomed to the gradual increase or the fan rotational frequency, so that low noises can be realized.

It is judged in step S77 whether or not the internal temperature of the equipment body is equal to or more than 55 degree. More specifically, with respect to sub micom 4, CPU 1 judged whether or not the temperature value detected by the temperature sensor 9 is equal to or more than 55 degree.

In step S77, when the internal temperature of the equipment body is not equal to nor more than 55 degree, the flow is shifted to step S78 and it is judged in step S78 whether or not the internal temperature of the equipment body is equal to or more than 35 degree. More specifically, with respect to the sub micom 4, the CPU 1 judges whether or not the temperature value detected by the temperature sensor 9 is equal to or more than 35 degree.

If the internal temperature of the equipment body is, not equal to nor more than 35 degree in step S78, the flow returns to step S77 and repeats the judgment whether or not the internal temperature of the equipment body is equal to or more than 55 degree in step S77 and the judgment whether or not the internal temperature of the equipment body is equal to or more than 35 degree in step S78.

If the internal temperature of the equipment body is equal to or more than 35 degree in step S74 and step S78, the flow is shifted to step S79 and a high speed rotation setting is performed in step S79. More specifically, with respect to the sub micom 4 for a high rotation condition, the CPU 1 makes the first fan control terminal FAN_CONT1 be a high-level (High), the second fan control terminal FAN_CONT2 be a high-level (High) and the fan switching control terminal FAN2_SW be a high-level (High), all of which are controlled by a fan control program. In this way, the supply of the 12V-system-drive power supply voltage from the power supply board 5 and the relay board 6 to the first fan (FAN 1) 7 and the second fan (FAN 2) 8 is performed by a voltage value or a duty of a pulse width which corresponds to the high speed rotation setting, so that both the first fan (FAN 1) 7 and the second fan (FAN 2) 8 becomes a high speed rotating state.

In this way, when the internal temperature becomes equal to or more than 35° C., the first fan (FAN 1) 7 and the second fan (FAN 2) 8 is made rotated in a high speed and the inside is cooled such that the internal temperature can be cooled equal to or less than 35° C. which is the guarantee temperature of the used device.

Here, when the high speed rotation is performed by means of the first fan (FAN 1) 7 and the second fan (FAN 2) 8, it is designed such that the rotational frequency is controlled to rise in a ramp-shape.

FIG. 9 is a diagram showing the ramp-shaped rising of the rotational frequency. In FIG. 9, when the CPU 1 makes the sub micom 4 perform the high speed rotation by means of the first fan (FAN 1) 7 and the second fan (FAN 2) 8, it is designed such that the rotational frequency is controlled to rise in a ramp-shape during a duration of a period T11 as shown as 91.

It is judged in step S80 whether or not the internal temperature of the equipment body is equal to or more than 55 degree. More specifically, with respect to sub micom 4, CPU 1 judged whether or not the temperature value detected by the temperature sensor 9 is equal to or more than 55 degree.

In step S80, when the internal temperature of the equipment body is not equal to nor more than 55 degree, the flow is shifted to step S81 and it is judged in step S81 whether or not the internal temperature of the equipment body is equal to or more than 35 degree. More specifically, with respect to the sub micom 4, the CPU 1 judges whether or not the temperature value detected by the temperature sensor 9 is equal to or more than 35 degree.

If the internal temperature of the equipment body is not equal to nor more than 35 degree in step S81, the flow returns to step S80 and repeats the judgment whether or not the internal temperature of the equipment body is equal to or more than 55 degree in step S80 and the judgment whether or not the internal temperature of the equipment body is equal to or more than 35 degree in step S81.

If the internal temperature of the equipment body is equal to or less than 35 degree in step S81, the flow returns to step S76 and repeats the low rotation setting in step S76, the judgment whether or not the internal temperature of the equipment body is equal to or more than 55 degree in step S77 and the judgment whether or not the internal temperature of the equipment body is equal to or more than 35 degree in step S78 and further repeats the high rotation setting in step S79, the judgment whether or not the internal temperature of the equipment body is equal to or more than 55 degree in step S80 and the judgment whether or not the internal temperature of the equipment body is equal to or less than 35 degree in step S81.

If the internal temperature of the equipment body is equal to or more than 55 degree in step S73, step S77 or step S80, the flow is shifted to step S82 and an emergency process is performed in step S82. More specifically, it is designed that the emergency process is performed by the CPU 1 with respect to sub micom 4 as 55° C. is considered to be abnormal for the internal temperature, for example, to control as its state function such that it is shifted from the power-on state to the power-off state.

In this way, the CPU 1 makes the sub micom 4 observe the temperature by using the feedback of the temperature value to both the CPU 1 and the sub micom 4 by means of the temperature sensor 9 such that a high speed rotation response of the first fan (FAN 1) 7 and the second fan (FAN 2) 8 at the temperature-rise and also an emergency response at an abnormally high temperature (equal to or more than 55 degree) can be performed.

In this way, by controlling the fan rotational frequency to rise in a ramp-shape, an effect can be obtained such that the equipment having a network connecting function is made quiet at the polling time and the power consumption is reduced by stopping the fan when the power supply is made ON.

The above mentioned exemplified embodiments according to the present invention are not limited only by the disclosure and it is needless to say that appropriate changes can be applied without departing from the scope of the claims of the present invention.

The fan control apparatus according to the present invention, as a fan control apparatus which cools the inside of an equipment body by a cooling fan provided in said equipment body, comprises temperature detecting means for detecting the temperature in said equipment body; temperature control means for controlling said cooling fan according to the temperature value detected by said temperature detecting means; communication means for communicating with a server connected to said equipment body by means of a network; and time control means for controlling said cooling fan according to the time value based on the communication commencement by said communication means; wherein the control of said cooling fan is performed by using said temperature control means and said time control means, so that the cooling fan is controlled according to the time value based on the communication commencement by the communication means using the time control means in addition to the feedback of the detected temperature value to the temperature control means using the temperature detecting means where an effect that noise reduction can be realized by the time axis control of the fan can be obtained.

Additionally, in the fan control apparatus according to the present invention, said communication means performs communication of a definite duration in a predetermined interval as mentioned above and said time control means stops the operation of said cooling fan until the value of said definite duration elapses, so that it is possible to reduce noises, owing to the fact that the polling period by the communication means is a short period, by using a method where the fan operation is made stopped for a definite duration from the starting time by means of the time control means and thus an effect is obtained that quietness can be realized at the polling time of the equipment which has the network connecting function and the power consumption can be reduced by the fan stop when the power supply is made on.

Further, since said time control means changes the value of said definite duration in the fan control apparatus according to the present invention as mentioned above, the stop period is thus changed by the time at the starting time when the polling is performed and the program reservation data are transferred during the fan stop period after the equipment body is activated, so that, for example, the fan stop period can be prolonged during the nighttime, because the temperature in the equipment body is low such that the data transfer can be performed definitely and alternately, the temperature in the equipment body becomes high during the daytime, because the equipment body is often in use, and for this reason, the stop period is made shorter and the temperature rise can be suppressed.

Further, in the fan control apparatus according to the present invention, operation mode control means which performs said cooling fan control corresponding to the operation modes of said equipment body is provided, and therefore, by performing the fan control in response to the device operation mode in this manner, the total power consumption varies in accordance with the operation mode of the device which is used in the equipment body, so that it is possible to realize the rotational noise reduction of the fan and the reduction of the power consumption by performing a control according to the device operation mode in the closed loop by the temperature sensor more minutely, and for example, it is possible to control minutely by changing the ratio of the effective rotational frequency with respect to the fan rotational frequency which is set by assuming the power consumption according to the combination of the above mentioned device operation modes.

Further, in the fan control apparatus according to the present invention, ramp-shaped rising control means to control is provided such that the rotational frequency of said cooling fan rises in a ramp-shape as mentioned above, and therefore, by controlling the ramp-shaped rising edge of the fan rotational frequency, it is possible to reduce rotational noises for the auditory sense when the low and high speed rotations of the fan are set, and by controlling the rotational frequency to increase gradually to a certain level in several 10 seconds, the auditory sense will get accustomed to the gradual increase or the fan rotational frequency, so that low noises can be realized.

Additionally, the fan control method according to the present invention, as a fan control method which cools the inside of an equipment body by a cooling fan provided in said equipment body, comprises communication step for communicating by using communication means with a server connected to said equipment body by means of a network; temperature detecting step for detecting the temperature in said equipment body by using temperature detecting means; temperature control step for controlling said cooling fan by using temperature control means according to the temperature value detected by said temperature detecting means; and time control step for controlling said cooling fan by using time control means according to the time value based on the communication commencement by said communication means; wherein the control of said cooling fan is performed by using said temperature control means and said time control means, so that the cooling fan is controlled according to the time value based on the communication commencement by the communication step using the time control step in addition to the feedback of the detected temperature value to the temperature control step using the temperature detecting step and thus an effect that noise reduction can be realized by the time axis control of the fan can be obtained.

Additionally, in the fan control apparatus according to the present invention, said communication step performs communication of a definite duration in a predetermined interval as mentioned above and said time control step stops the operation of said cooling fan until the value of said definite duration elapses, so that it is possible to reduce noises, owing to the fact that the polling period by the communication step is a short period, by using a method where the fan operation is made stopped for a definite duration from the starting time by step of the time control step and thus an effect that the equipment having a network connecting function is made quiet at the polling time and the power consumption is reduced by stopping the fan when the power supply is made ON is obtained.

Further, since said time control means changes the value of said definite duration in the fan control method according to the present invention as mentioned above, the stop period is changed by the time at the starting time when the polling is performed and the program reservation data are transferred during the fan stop period after the equipment body is activated, so that, for example, the fan stop period can be prolonged during the nighttime, because the temperature in the equipment body is low such that the data transfer can be performed definitely and alternately, the temperature in the equipment body becomes high during the daytime, because the equipment body is often in use, and for this reason, the stop period is made shorter and the temperature rise can be suppressed.

Further, in the fan control method according to the present invention, an operation mode control step performing said cooling fan control by using operation mode control means according to the operation modes of said equipment body is provided, and therefore, by performing the fan control in response to the device operation mode, the total power consumption varies in accordance with the operation mode of the device which is used in the equipment body, so that it is possible to realize the rotational noise reduction of the fan and the reduction of the power consumption by performing a control according to the device operation mode in the closed loop by the temperature detecting step more minutely, and for example, it is possible to control minutely by changing the ratio of the effective rotational frequency with respect to the fan rotational frequency which is set by assuming the power consumption according to the combination of the above mentioned device operation modes.

Also, in the fan control method according to the present invention, ramp-shaped rising control step using ramp-shaped rising control means is provided such that the rotational frequency of said cooling fan rises in a ramp-shape as mentioned above, and therefore, by controlling the ramp-shaped rising edge of the fan rotational frequency, it is possible to reduce rotational noises for the auditory sense when the low and high speed rotations of the fan are set, and by controlling the rotational frequency to increase gradually to a certain level in several 10 seconds, the auditory sense will get accustomed to the gradual increase or the fan rotational frequency, so that low noises can be realized.

Having described preferred embodiments of the invention with reference to the accompanying drawings, it is to be understood that the invention is not limited to those precise embodiments and that various changes and modifications could be effected therein by one skilled in the art without departing from the spirit or scope of the invention as defined in the appended claims.

What is claimed is:

1. A fan control apparatus for cooling an inside of an equipment body by a cooling fan arranged in said equipment body, the apparatus comprising:
   temperature detecting means for detecting a temperature in said equipment body;
   temperature control means for controlling said cooling fan according to a temperature value detected by said temperature detecting means;
   communication means for communicating over a network with a server at predetermined intervals, the communicating being carried out for a predefined duration during each predetermined interval; and
   time control means for controlling said cooling fan in association with the communicating performed by said communication means,
   the controlling of said cooling fan being performed by said temperature control means and said time control means such that said time control means stops operation of said cooling fan during the predefined duration that the communication means communicates with the server and causes said cooling fan to operate in a low state after the predefined duration has elapsed, and said temperature control means causes said cooling fan to operate in a high state whenever the detected temperature value is greater than or equal to a predefined value regardless of whether the predefined duration has elapsed.

2. The fan control apparatus according to claim 1, further comprising operation mode control means for controlling said cooling fan in response to an operation mode of said equipment body.

3. A fan control apparatus for cooling an inside of an equipment body by a cooling fan arranged in said equipment body, the apparatus comprising:
   temperature detecting means for detecting a temperature in said equipment body;
   temperature control means for controlling said cooling fan according to a temperature value detected by said temperature detecting means;
   communication means for communicating with a server connected to said equipment body by a network; and
   time control means for controlling said cooling fan according to a time value based on a commencement of a communication by said communication means,
   in which control of said cooling fan is performed by said temperature control means and said time control means,
   in which said communication means performs communication for a defined time duration at predetermined times and said time control means stops operation of said cooling fan until the defined time duration elapses, and in which said time control means changes the time value of said defined time duration in response to the absolute time.

4. A fan control apparatus for cooling an inside of an equipment body by a cooling fan arranged in said equipment body, the apparatus comprising:
   temperature detecting means for detecting a temperature in said equipment body;
   temperature control means for controlling said cooling fan according to a temperature value detected by said temperature detecting means;
   communication means for communicating over a network with a server at predetermined intervals for a predefined duration; and
   time control means for controlling said cooling fan according to a time value associated with the communicating performed by said communication means, and
   ramp-shaped rising control means for controlling a rise in rotational frequency of said cooling fan so that when said cooling fan is caused to increase its rotational frequency to operate in a high state, said ramp-shaped rising control means controls the rotational frequency of the cooling fan to ramp up gradually to the high state over a predefined period, thereby reducing noise generated by the cooling fan during the change to the high state,
   the controlling of said cooling fan being performed by said temperature control means, said time control means, and said ramp-shaped rising control means such that said time control means stops operation of said cooling fan during the predefined duration and causes said cooling fan to operate in a low state after the predefined duration has elapsed, and said temperature control means and said ramp-shaped rising control means cause said cooling fan to ramp up gradually over the predefined period and operate in the high state whenever the detected temperature value is greater than or equal to a predefined value regardless of whether the predefined duration has elapsed.

5. A fan control method for cooling an inside of an equipment body by a cooling fan arranged in said equipment body, the method comprising:
   a communication step for communicating over a network with a server at predetermined intervals, the communicating being carried out for a predefined duration during each predetermined interval;
   a temperature detecting step for detecting a temperature in said equipment body;
   a temperature control step for controlling said cooling fan according to a temperature value detected in said temperature detecting step; and
   a time control step for controlling said cooling fan in association with the communicating performed in said communication step,
   the controlling of said cooling fan being performed such that operation of said cooling fan is stopped during the predefined duration that the communication means communicates with the server and said cooling fan is caused to operate in a low state after the predefined duration has elapsed, and said cooling fan is caused to operate in a high state whenever the detected temperature value is greater than or equal to a predefined value regardless of whether the predefined duration has elapsed.

6. The fan control method according to claim 5, further comprising an operation mode control step for controlling said cooling fan in response to an operation mode of said equipment body.

7. A fan control method for cooling an inside of an equipment body by a cooling fan arranged in said equipment body, the method comprising:
   a communication step for communicating by using a communication unit with a server connected to said equipment body by a network;
   a temperature detecting step for detecting a temperature in said equipment body by using a temperature detector;
   a temperature control step for controlling said cooling fan by using a temperature controller according to a temperature value detected in said temperature detecting step; and
   a time control step for controlling said cooling fan by using a time controller according to a time value based on a time of a commencement of communication in said communication step,
   in which control of said cooling fan is performed by using said temperature, controller, and said time controller,
   in which said communication step performs communication for a definite duration at predetermined times and said time control step stops operation of said cooling fan until the defined time duration elapses, and
   in which said time control step changes the defined time duration in response to the absolute time.

8. A fan control method for cooling an inside of an equipment body by a cooling fan arranged in said equipment body, the method comprising:
   a communication step for communicating over a network with a server at predetermined intervals for a predefined duration;
   a temperature detecting step for detecting a temperature in said equipment body;
   a temperature control step for controlling said cooling fan according to a temperature value detected in said temperature detecting step;
   a time control step for controlling said cooling fan according to a time value associated with the communicating performed in said communication step; and
   a ramp-shaped rising control step for controlling a rise in rotational frequency of said cooling fan so that when said cooling fan is caused to increase its rotational frequency to operate in a high state, the rotational frequency is controlled to ramp up gradually to the high state over a predefined period, thereby reducing noise generated by the cooling fan during the change to the high state,
   the controlling of said cooling fan being performed such that operation of said cooling fan is stopped during the predefined duration and said cooling fan is caused to operate in a low state after the predefined duration has elapsed, and said cooling fan is caused to ramp up gradually over the predefined period and operate in the high state whenever the detected temperature value is greater than or equal to a predefined value regardless of whether the predefined duration has elapsed.

9. A fan control apparatus for cooling an equipment by a cooling fan, the apparatus comprising:
   temperature detecting means for detecting a temperature of said equipment;
   communication means for communicating over a network with a server at predetermined intervals, the communicating being carried out for a predefined duration during each predetermined interval; and control means for controlling said cooling fan according to a temperature value detected by said temperature detecting means and in association with the communicating performed by said communication means such that said control means stops operation of said cooling fan during the predefined duration that the communication means communicates with the server, causes said cooling fan to operate in a low state after the predefined duration has elapsed, and causes said cooling fan to operate in a high state whenever the detected temperature value is greater than or equal to a predefined value regardless of whether the predefined duration has elapsed.

10. A fan control method for cooling an equipment by a cooling fan, the method comprising the steps of:
  detecting a temperature of said equipment;
  communicating over a network with a server at predetermined intervals, the communicating being carried out for a predefined duration during each predetermined interval; and
  controlling said cooling fan according to a temperature value detected by the detecting step and in association with the communicating performed by the communicating step such that operation of said cooling fan is stopped during the predefined duration that the communication means communicates with the server, said cooling fan is caused to operate in a low state after the predefined duration has elapsed, and whenever the detected temperature value is greater than or equal to a predefined value, said cooling fan is caused to operate in a high state regardless of whether the predefined duration has elapsed.

* * * * *

UNITED STATES PATENT AND TRADEMARK OFFICE
CERTIFICATE OF CORRECTION

| | | |
|---|---|---|
| PATENT NO. | : 7,571,617 B2 | Page 1 of 1 |
| APPLICATION NO. | : 10/782434 | |
| DATED | : August 11, 2009 | |
| INVENTOR(S) | : Kenichi Inoue and Toshiaki Notsuyu | |

It is certified that error appears in the above-identified patent and that said Letters Patent is hereby corrected as shown below:

On the Title Pg, after Item (*) Notice please make reference to the Terminal Disclaimer filed.

Signed and Sealed this
Nineteenth Day of April, 2011

David J. Kappos
*Director of the United States Patent and Trademark Office*